United States Patent
Garrastacho et al.

(10) Patent No.: US 8,552,690 B2
(45) Date of Patent: Oct. 8, 2013

(54) METHOD AND SYSTEM FOR AUTOMATICALLY DETECTING A VOLTAGE OF A BATTERY

(75) Inventors: Eddie Garrastacho, Miami, FL (US); Steve Tzu-Hsiung Chuang, Kowloon (HK); Saied Hussaini, Miami, FL (US)

(73) Assignee: Rally Manufacturing, Inc., Miami, FL (US)

( * ) Notice: Subject to any disclaimer, the term of this patent is extended or adjusted under 35 U.S.C. 154(b) by 341 days.

(21) Appl. No.: 12/941,624

(22) Filed: Nov. 8, 2010

(65) Prior Publication Data

US 2011/0115442 A1 May 19, 2011

Related U.S. Application Data

(60) Provisional application No. 61/258,805, filed on Nov. 6, 2009.

(51) Int. Cl.
*H01M 10/44* (2006.01)
*H01M 10/46* (2006.01)

(52) U.S. Cl.
USPC .......................................................... 320/134

(58) Field of Classification Search
USPC ................. 320/107, 128, 134, 135, 136, 155, 320/DIG. 12, DIG. 13
See application file for complete search history.

(56) References Cited

U.S. PATENT DOCUMENTS

| | | | |
|---|---|---|---|
| 5,049,804 A | 9/1991 | Hutchings | |
| 5,250,891 A | 10/1993 | Glasgow | |
| 5,619,116 A | 4/1997 | Takano et al. | |
| 5,973,480 A | 10/1999 | Takano et al. | |
| 6,161,248 A | 12/2000 | Merkel et al. | |
| 6,188,199 B1 | 2/2001 | Beutler et al. | |
| 6,191,552 B1 | 2/2001 | Kates et al. | |
| 6,275,006 B1 * | 8/2001 | Koike et al. | 320/125 |
| 6,337,557 B1 | 1/2002 | Kates et al. | |
| 6,523,218 B1 | 2/2003 | Kotlarski | |
| 6,553,607 B1 | 4/2003 | De Block | |
| 6,611,988 B1 | 9/2003 | De Block | |
| 6,836,926 B1 | 1/2005 | De Block | |
| 6,973,698 B1 | 12/2005 | Kotlarski | |
| 6,978,512 B2 | 12/2005 | Dietrich et al. | |
| 7,228,588 B2 | 6/2007 | Kraemer et al. | |
| 7,293,321 B2 | 11/2007 | Breesch | |
| 7,323,847 B2 | 1/2008 | Meyer et al. | |
| RE40,223 E | 4/2008 | Koike et al. | |
| 7,365,515 B2 | 4/2008 | Takano et al. | |
| 7,451,520 B2 | 11/2008 | Weiler et al. | |
| 7,468,596 B2 | 12/2008 | Shum | |
| 7,484,264 B2 | 2/2009 | Kraemer et al. | |
| 7,523,520 B2 | 4/2009 | Breesch | |
| 2003/0048096 A1 | 3/2003 | Liu et al. | |
| 2004/0124821 A1 * | 7/2004 | Elkin et al. | 323/303 |
| 2005/0189914 A1 | 9/2005 | Esses | |
| 2006/0207050 A1 | 9/2006 | Shanmugham et al. | |

FOREIGN PATENT DOCUMENTS

DE 100 43 426 3/2002

* cited by examiner

*Primary Examiner* — Edward Tso
(74) *Attorney, Agent, or Firm* — Berenato & White, LLC

(57) ABSTRACT

Embodiments disclosed herein provide methods and systems for auto-voltage detect chargers. One disclosed method comprises the steps of determining a condition of a battery based at least in part on a measured response to a predetermined test charge; and determining a voltage rating of the battery based at least in part on the condition of the battery and a response to a precharge process.

23 Claims, 22 Drawing Sheets

METHOD AND SYSTEM FOR AUTOMATICALLY DETECTING A VOLTAGE OF A BATTERY

CROSS-REFERENCE TO RELATED APPLICATION(S)

This application claims the benefit of priority of U.S. provisional application Ser. No. 61/258,805 filed Nov. 6, 2009, entitled "Auto-Voltage Detect Charger," the complete disclosure of which is incorporated herein by reference and to which priority is claimed.

FIELD OF THE INVENTION

The present invention relates to battery chargers, and more particularly to automatic voltage detection chargers.

BACKGROUND OF THE INVENTION

Conventional methods for battery charging are cumbersome, time-consuming, and error-prone. Current battery chargers capable of charging batteries of different voltages require users to manually select a voltage rating of the battery to be charged in order for the battery to be properly charged, and not damaged by the charging process. If a user selects a wrong battery voltage rating, the battery may not be properly charged, and the battery and/or the charger may be permanently damaged.

Manual selection of the battery voltage, however, is subject to the user actually knowing the proper battery voltage rating, and correctly selecting the voltage rating on the battery charger itself. Because rechargeable batteries can have different voltage ratings, even among batteries with the same form factor, the voltage rating of a specific battery may not be obvious to a user. Furthermore, physically selecting a voltage rating on a battery charger may be hampered by environmental conditions, such as darkness or moisture, or deterioration of the controls on the battery charger itself.

Thus there is a need for chargers that automatically detect the voltage of a battery.

SUMMARY OF THE INVENTION

Embodiments disclosed herein provide methods and systems for auto-voltage detect chargers. For example, one embodiment comprises a method comprising the steps of determining a condition of a battery based at least in part on a response to a predetermined test charge; and determining a voltage rating of the battery based at least in part on the condition of the battery and a response to a precharge process.

Other embodiments and further details on various aspects of the invention, including apparatus, systems, methods, kits, articles, assemblies, and the like which constitute part of the invention, will become more apparent upon reading the following detailed description of the exemplary embodiments and viewing the drawings. It is to be understood that the invention is not limited in its application to the details set forth in the following description, figures, and claims, but is capable of other embodiments and of being practiced or carried out in various ways.

BRIEF DESCRIPTION OF THE DRAWING(S)

These and other features, aspects, and advantages of the invention are better understood when the following Detailed Description is read with reference to the accompanying drawings, wherein.

DETAILED DESCRIPTION OF EXEMPLARY EMBODIMENTS AND METHODS

Figure 1:
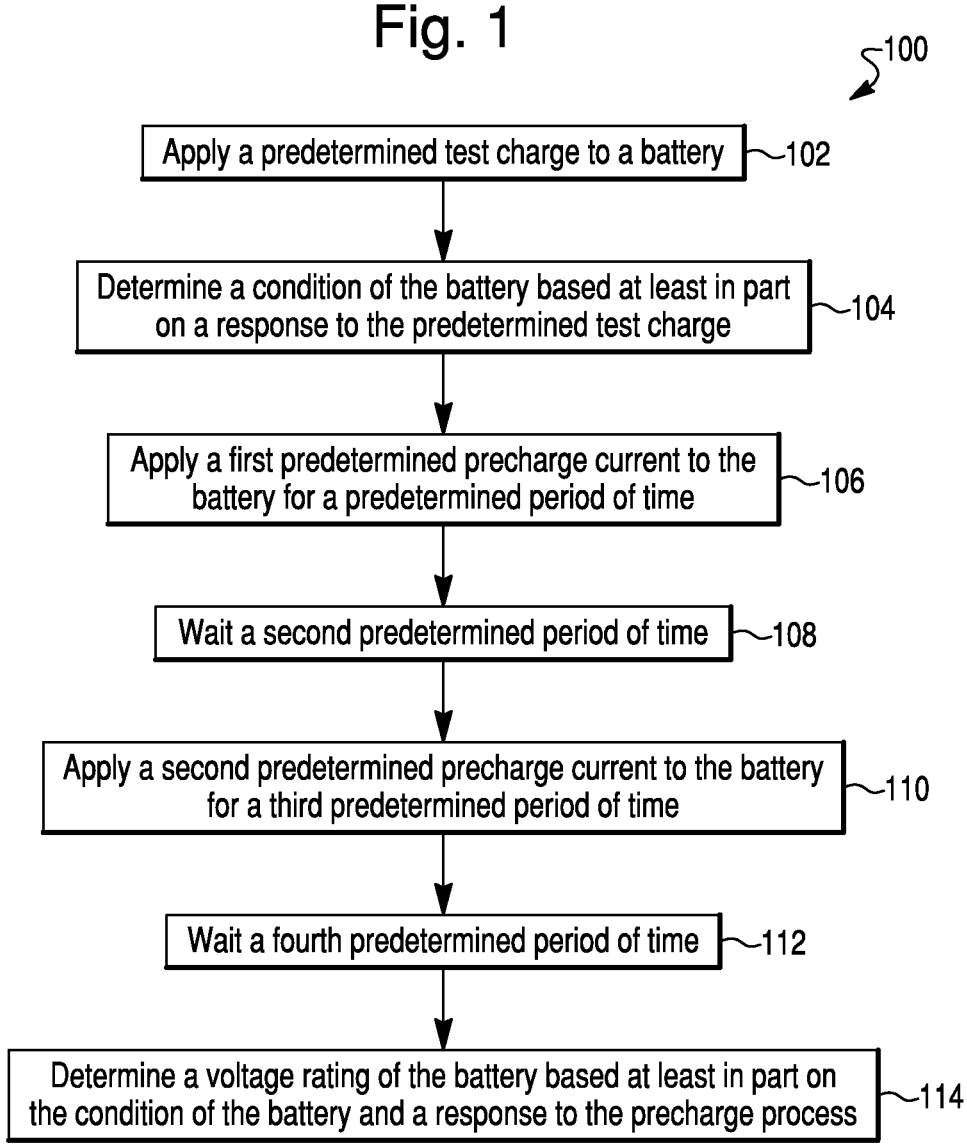
FIG. 1 is a flowchart of a first method for an auto-voltage detect charger.

Reference will now be made in detail to exemplary embodiments and methods of the invention as illustrated in the accompanying drawings, in which like reference characters designate like or corresponding parts throughout the drawings. It should be noted, however, that the invention in its broader aspects is not limited to the specific details, representative devices and methods, and illustrative examples shown and described in connection with the exemplary embodiments and methods.

In one exemplary method for auto-voltage detection, a battery charger includes a microprocessor, and is configured to monitor a plurality of characteristics of a battery, including the terminal voltage of the battery, the temperature of the battery, and a current supplied by the battery. The exemplar process for determining the voltage rating of the battery comprises a test charge phase and a precharge phase. During the test charge phase, the battery charger applies a predetermined test charge of 2 amps to a battery for 1 second. After the predetermined test charge, the battery charger measures the initial terminal voltage of the battery, and the microprocessor determines a condition of the battery based at least in part on the voltage response. The microprocessor determines the condition of the battery, such as fully charged, ready to be charged, or error/faulty, by comparing the initial terminal voltage of the battery against a series of threshold levels. A battery ready to be charged may respond to the test charge with an initial terminal voltage between a minimum and a maximum voltage threshold.

When the microprocessor determines that a battery condition is ready to be charged, then the precharge phase is initiated. The precharge phase begins by applying a small precharge current, such as 2 amps, to the battery, for a predetermined period of time, such as 60 or 120 seconds. The battery charger then waits (i.e. applies no current) for a second predetermined period of time (e.g. 30 or 60 seconds). The battery charger repeats this precharge cycle, and applies a 2 amp precharge current for 60 or 120 seconds, and applies no current (or a negligible current) for 30 or 60 seconds.

Finally, the charger measures the post precharge voltage of the battery. By comparing the post precharge voltage of the battery to a series of threshold levels, the microprocessor determines a voltage rating of the battery based at least in part on the charge-ready condition of the battery and the post-precharge voltage of the.

Referring now to the drawings in which like numerals indicate like elements through the several figures, FIG. 1 is a flowchart of a first method for an auto-voltage detect charger. The method 100 begins with a battery charger applying a predetermined test charge to a battery engaged by the charger 102. The magnitude of the predetermined test charge may be between 1 amp and 10 amps, such as a 2 amp test charge. The duration of the predetermined test charge can be between 0.5 seconds and 10 seconds. In one embodiment, the test charge is applied for a short period of time, such as 1 or 2 seconds, in order to stabilize the battery status and to prepare the battery for charging and analysis.

During one or more steps of the method 100, one or more characteristics of a battery may be monitored. For example, the battery charger may monitor the voltage and the temperature of the battery.

Various batteries may be used according to systems and methods of the present invention. The battery may comprise a 6 volt (V), 12 volt, or 24 volt battery. Or, the battery may be rated at other voltages, e.g. a 48 volt or 72 volt battery. The battery may comprise a lead acid battery, sealed acid battery, gel battery, or an absorbed glass mat (AGM) battery. In other embodiments, the battery may comprise another type of battery.

After the battery charger applies a predetermined test charge to the battery 102, a microprocessor in communication with the battery charger determines a condition of the battery based at least in part on a response to the predetermined test charge 104. The response may comprise an initial terminal voltage, or a battery temperature, and may be measured immediately after the test charge is applied to the battery.

The condition of the battery may be charged, ready for charging, or fault/error. The microprocessor may determine the condition of the battery by comparing the initial terminal voltage of the battery against one or more voltage values, or levels. In some scenarios, the microprocessor may determine the condition of the battery based at least in part on whether the initial terminal voltage lies above, below, or within a certain range of voltage values.

If the initial terminal voltage of the battery after the test charge is above or below certain voltage levels, or thresholds, then the microprocessor may determine that the condition of the battery is fault or error. For example, if the initial terminal voltage lies below a low voltage threshold, such as 1.5V, then the microprocessor may determine that the battery is malfunctioning, broken, and/or not correctly inserted into the battery charger. Or, if the initial terminal voltage lies above a high voltage threshold, such as 28V, then the microprocessor may also determine that the battery is malfunctioning, broken, and/or not correctly inserted.

The voltage thresholds may be predetermined based on the expected voltage ratings of the batteries to be tested. For example, if the battery charger is expected to charge batteries having voltage ratings of 6V, 12V, and 24V, then the low voltage threshold may be set at some value below 6V, such as at 1.5V, and the high voltage threshold may be set at some value above 24V, such as 28V. In another example, if 24V and 48V batteries are expected to be tested, then the low voltage threshold may be set below 24V (i.e. 20V), and the high voltage threshold may be set above 48V (i.e. 54V). It may be expected that a battery having any voltage above or below such thresholds is malfunctioning, and should not be used.

After the condition of the battery has been determined, an indication of the condition may be generated. If the battery condition is ready to be charged, then a steady green light may be activated. Or, if the battery condition is fault/error, a red light may be activated. Battery condition indicators may be audible, visual, or tactile. Examples of such indications include warning beeps, blinking lights, or vibration. Alternatively, the battery charger may generate no indication at all, but simply begin the charging process, or turn off.

In some embodiments, the microprocessor may accurately determine both the condition of a battery along with the battery's voltage rating immediately following the test charge phase 102-104, without having to initiate the precharge process 106 (described below). In one embodiment, a test charge 102 is applied to a battery, and the initial terminal voltage is greater than 16V but less than 28V. Based on this initial terminal voltage range, the microprocessor determines that the condition of the battery is charged. Additionally, the microprocessor determines that the voltage rating of the charged battery is 24V, i.e., a voltage rating corresponding to a battery voltage rating within the voltage range of 16V to 28V.

In other embodiments, the battery charger may only be able to determine a condition of the battery based on the battery's response to the test charge. For example, an initial terminal voltage after the test charge phase is measured between 1.5V and 16V. Based on this initial terminal voltage, the microprocessor determines that the condition of the battery is ready for charging, but cannot accurately determine the voltage rating of the battery.

A battery in fault or error condition may be improperly connected to the device, or in one alternative, broken. The condition of the battery may be based at least in part on the voltage of the battery. The condition of the battery may also be based on other characteristics of the battery, such as the battery temperature.

After the microprocessor determines the condition of the battery, the microprocessor initiates a precharge process, illustrated in FIG. 1 as steps 106-112. During the precharge process, the battery charge applies a small precharge current to the battery, waits, applies a small precharge current to the battery again, and waits again. As shown in FIG. 1, the precharge process begins with the battery charger applying a first predetermined precharge current to the battery for a predetermined period of time 106. The precharge current may comprise a 2 A current. The predetermined period of time may be 30 seconds, 45 seconds, 60 seconds, or 120 seconds. The preferred pre-charge is a 2 amp constant current charge for 120 seconds.

After applying a precharge current 106, the battery charger waits for a second predetermined period of time 108. During the wait period, the battery charger applies no current (or a negligible current) to the battery. The second predetermined period of time may be the same amount of time as the first period of time, or may be a different period of time. For example, the second predetermined period of time may be 30 seconds, 45 seconds, 60 seconds, or some other time period. The preferred stop or wait period is 30 seconds.

As shown in steps 110-112, the precharge cycle is repeated. After the first wait step 108, the battery charger then applies a second predetermined precharge current to the battery for a third predetermined period of time 110. In some embodiments, the second predetermined precharge current is the same magnitude as the first predetermined precharge current. In other embodiments, the second predetermined precharge current is a different magnitude than the first predetermined precharge current.

The battery charger then waits for a fourth predetermined period of time 112. During the wait period, the battery charger applies no current (or a negligible current) to the battery. The fourth predetermined period of time may be the same amount of time as the other predetermined periods of time, or may be a different period of time. In one embodiment, the first, second, third, and fourth predetermined periods of time are all 60 seconds. As shown in FIG. 1, the precharge phase comprises two cycles, each cycle comprising a precharge current period and a wait period. In other methods according to the present invention, the precharge phase may comprise three or more cycles of a precharge current and a wait period.

Finally, after the test charge phase 102-104 and the precharge phase 106-112, the microprocessor determines a voltage rating of the battery based at least in part on the condition of the battery and a response to the precharge process 114. The response to the precharge process may comprise a measurement of the terminal voltage of the battery after the precharge process. The voltage rating of the battery may be determined, at least in part by comparing the terminal voltage of the battery after the precharge process against one or more voltage thresholds, or levels. In some scenarios, the microprocessor may determine the voltage rating of the battery based at least in part on whether the terminal voltage of the battery after the precharge process lies above, below, or within a certain range of voltage values.

In some cases, a battery may not respond (i.e. may not charge) to the precharge process 106-112. For example, if the terminal voltage of the battery after the precharge process lies below a certain voltage level, or threshold, then the microprocessor may not be able to determine that the voltage rating of the battery. Instead, the microprocessor may determine that the condition of the battery is fault or error—that is, that the battery is malfunctioning, broken, and/or not correctly inserted into the battery charger.

In one embodiment, a microprocessor causes a 2 A test charge to be applied to a battery for a duration of 1 second. After the 2 A test charge is applied to the battery, the initial terminal voltage of the battery is measured at 9V. In the embodiment, the 9V battery voltage lies between the low voltage threshold of 1.5V and the high voltage threshold of 28V. Accordingly, the microprocessor determines that the battery condition is ready to be charged.

Next, the microprocessor initiates the precharge phase, which consists of two precharge cycles. The precharge phase beings with the microprocessor causing a first predetermined precharge current of 2 A to be applied to the battery for 60 seconds. After the first precharge current, no charge (i.e. 0 A) is applied to the battery for 60 seconds. The precharge cycle is repeated, and a second predetermined precharge current of 2 A is applied to the battery for 60 seconds. The last step of the precharge process in the example comprises waiting another 60 seconds.

In the embodiment, the final terminal voltage of the battery is measured at 11.5V after the precharge process. The microprocessor compares the final terminal voltage to a plurality of voltage ranges corresponding to different batteries. First, the microprocessor determines that the battery was successfully charged because the final terminal voltage is greater than the minimum voltage threshold 1.5V. Next, the microprocessor determines that the battery is not a 6V battery, because it has a voltage greater than 9V. Finally, the microprocessor determines that the voltage rating of the battery is 12V, since the final terminal battery voltage is in the range of 9V to 18V. In this manner, the voltage rating of a battery is determined automatically without user input, even when the terminal battery voltage (e.g. 11.5V) does not exactly match a standard voltage rating (e.g. 12V).

Figure 2:
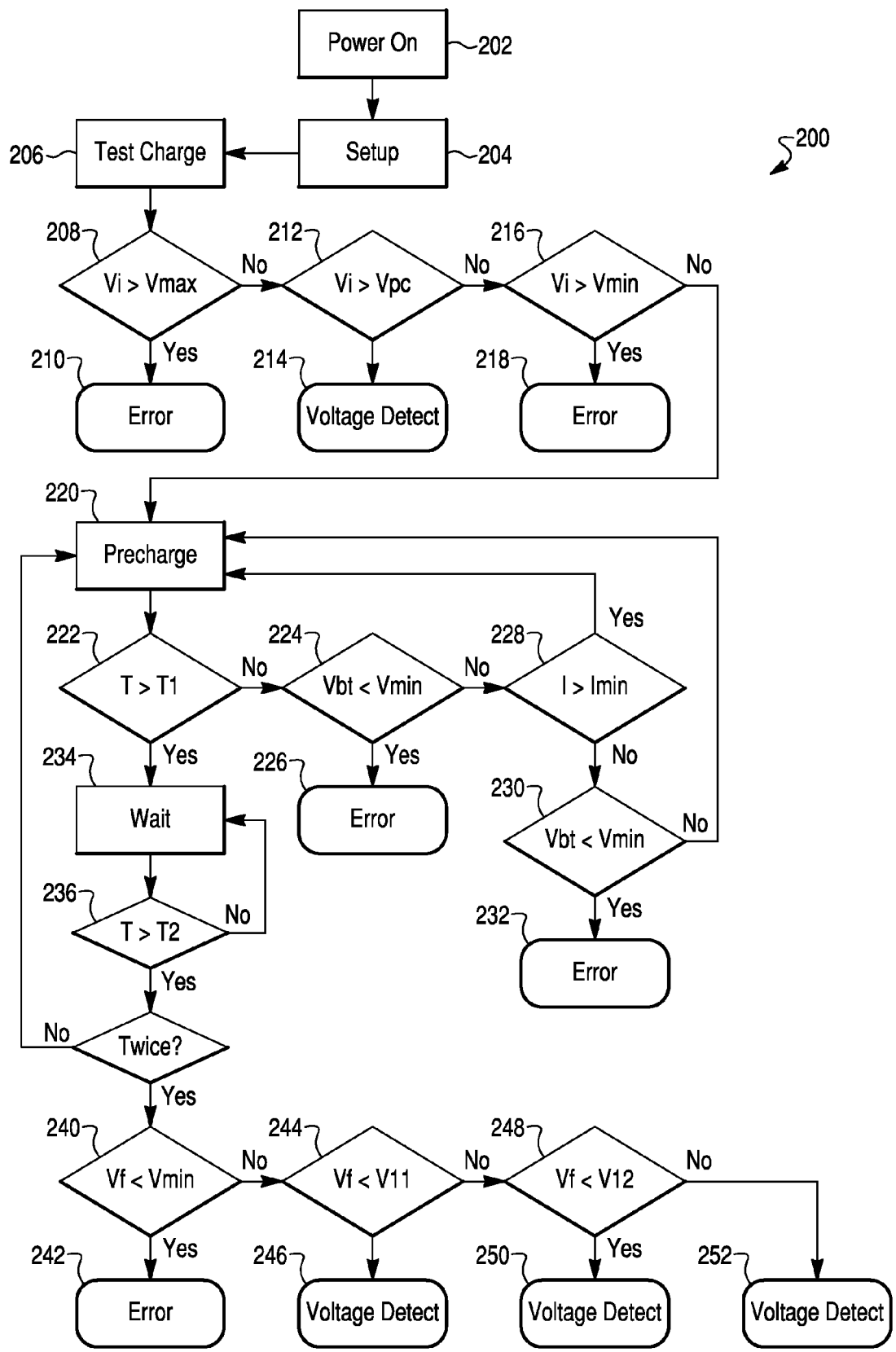
FIG. 2 is a flowchart of a second method for an auto-voltage detect charger.

FIG. 2 is a flowchart of a second method for an auto-voltage detect charger. As shown in FIG. 2, the method 200 comprises two phases: a test charge phase 206-218 and a precharge phase 220-252. A condition of the battery is determined after the test charge phase, and a voltage rating of the battery is determined after the precharge phase.

The method 200 begins by powering on the system 202. After power on 202, a microprocessor control unit (MCU) in communication with a battery charger enters an initialization state, i.e. setup 204. During setup 204, the MCU clears and initializes memory, time values, and the state of each input/output (I/O) port. During setup 204, the MCU may begin to monitor one or more characteristics of a battery, such as the terminal voltage, current, and/or temperature of the battery. The MCU may monitor one or more characteristics of a battery during some or all of method 200.

After setup 204, the test charge phase 206 begins. As shown in FIG. 2, a test charge phase of the auto-voltage detect process comprises steps 206-218. During the test charge phase, a short initial charge is applied to the battery. The short, initial charge may be configured to provide an initial charge to the battery in order to determine whether a battery is ready to be charged or cannot be charged (i.e. is malfunctioning). The test charge phase begins by applying a predetermined test charge Itc to the battery 206. The predetermined test charge Itc may comprise a small, short charge, such as a 2 A charge applied for a duration of 1 second.

After the test charge is applied to the battery, the MCU measures the initial terminal voltage of the battery Vi, and compares the initial terminal voltage Vi to a plurality of voltage levels, or thresholds. As shown in FIG. 2, the MCU first compares the initial terminal voltage Vi with a first predetermined threshold, the maximum voltage threshold Vmax 208. The maximum voltage threshold of the battery Vmax may be based on the expected voltage range of the battery being tested. For example, if the voltage range of the battery is expected to be between 6V and 24V, the maximum voltage threshold Vmax may be set to 28V. Or, if the voltage range of the battery is expected to be between 24V and 48V, the maximum voltage threshold Vmax may be set to 54V.

If the initial terminal voltage Vi exceeds the maximum voltage threshold Vmax, then the battery may be malfunctioning, or in an error condition. In one example, the maximum voltage threshold Vmax is set at 28V. If the battery responds to the initial test charge 206 with an initial terminal voltage Vi above 28V, then the MCU may determine that the battery is malfunctioning, or there is an error 210. In the example, the error state 210 reflects that the battery may not be charged by the charger due to an improper voltage.

If the initial terminal voltage Vi does not exceed the maximum voltage threshold Vmax 208, then the MCU may compare the initial terminal voltage Vi with a precharge threshold Vpc 212. If the initial terminal voltage Vi exceeds the precharge threshold Vpc, then the condition and the voltage rating of the battery may be immediately determined 214. For example, if an initial terminal voltage Vi measured at 25V exceeds a precharge threshold Vpc of 20V, but does not exceed a maximum voltage threshold Vmax of 28V, then the MCU may determine that the battery is charged, and rated at 24V. By setting the voltage range between the precharge threshold Vpc and the maximum voltage threshold Vmax to encompass one battery voltage rating, the charged batteries having a voltage rating in the corresponding voltage range may be quickly and accurately determined.

If the initial terminal voltage Vi does not exceed the first predetermined threshold Vmax 208, and does not exceed the precharge threshold Vpc 212, then the battery charger compares the initial terminal voltage Vi with a third predetermined threshold, a minimum voltage threshold Vmin 216. If the initial terminal voltage Vi is below the minimum voltage threshold, then the MCU may determine that the battery is malfunctioning, or there is an error 218. The error condition 218 may indicate that the battery is broken, incorrectly installed, or has been removed from the auto-voltage detector. In some scenarios, the minimum voltage threshold Vmin is set to 1.5V. If the initial terminal voltage Vi is below 1.5V after the test charge 206, then the MCU determines that the battery condition is faulty/error 218.

If the battery is ready to be charged (i.e. not fully charged and not malfunctioning), then the precharge phase 220 begins. The MCU may determine that the battery is in a condition ready to be charged if the initial terminal voltage Vi of the battery lies between the minimum voltage threshold Vmin and the maximum voltage threshold Vmax. The precharge phase may consist of one or more cycles, each cycle comprising the steps of applying a predetermined precharge current to the battery, and a wait step.

The precharge phase 220 begins by applying a predetermined precharge current Ipc to for a first predetermined period of time T1 to the battery. In some embodiments, the predetermined precharge current Ipc has the same magnitude as the predetermined test charge Itc 206. In other embodiments, the predetermined precharge current Ipc has a different magnitude than the predetermined test charge Itc. Typically, the predetermined precharge current Ipc is applied to the battery for a much longer duration during the precharge phase 220 than the predetermined test charge Itc is applied to the battery during the test charge phase. In one embodiment, the predetermined precharge current is 2 amps, and is applied to the battery for a duration of 60 seconds. During the first predetermined period of time T1, the microprocessor continues to cause the precharge current to be applied until the predetermined period of time T1 is over 222.

The MCU may monitor one or more characteristics of the battery during the precharge phase 220. For example, the MCU may monitor the terminal voltage Vbt, current I, and the temperature of the battery. As shown in method 200, the voltage of the battery may be continually compared to the minimum voltage threshold Vmin 224 during the precharge phase. If the terminal battery voltage Vbt falls below the minimum voltage threshold Vmin, then the MCU may determine that the battery is malfunctioning, or there is an error 226. Error state 226 may indicate that the battery is broken, not properly installed, or has been removed from the auto-voltage detector.

If the current of the battery I stays above a predetermined current threshold Imin, i.e. a minimum current threshold 228, then the microprocessor will continue to cause the precharge current to be applied 220. If the current of the battery I falls below the minimum current threshold Imin, then the microprocessor may compare the terminal voltage of the battery Vbt against the minimum voltage threshold Vmin 230. If the current of the battery I falls below the minimum current threshold Imin 228 and the terminal voltage battery falls below the minimum voltage threshold Vmax, then the microprocessor may determine that the battery condition is faulty/error 232.

During the second step of the precharge cycle, the MCU causes the battery charger to wait for a predetermined wait time 234. In one embodiment, the predetermined wait time, i.e. the second predetermined period of time T2, is 30 seconds. In other embodiments, the wait time is some other duration, such as 45 seconds, 60 seconds, or 75 seconds. The wait step 234 continues 236 for the duration of the wait time.

After the second predetermined period of time T2 is over, i.e. the wait period has been completed, then the microprocessor checks to see if the precharge cycle has occurred twice, or only once 238. If the precharge cycle has only occurred once, then the precharge cycle will repeat 220. Otherwise, the MCU may measure the final terminal voltage of the battery Vf. In some embodiments, the precharge cycle may occur three or more times, rather than just two.

After the precharge phase 220 is completed, then the MCU measures the final terminal voltage Vf of the battery, and compares the final terminal voltage Vf against one or more voltage ranges intended to discover the voltage rating of the battery. As shown in FIG. 2, the MCU may first compare the final terminal voltage Vf to the minimum voltage threshold Vmin 240. If the final terminal voltage Vf lies below the minimum voltage threshold Vmin, then the MCU may determine that the battery is malfunctioning, or there is an error 242. Error condition 242 may indicate that the battery is broken, incorrectly installed, or has been removed from the auto-voltage detector.

If the final terminal voltage Vf exceeds the minimum voltage threshold Vmin, then the MCU compares the final terminal voltage Vf against a first predetermined voltage threshold V11 244. If the final terminal voltage Vf lies between the minimum voltage threshold Vmin and the first predetermined voltage threshold V11, then the microprocessor may determine the voltage rating of the battery corresponds to a battery with a voltage that would lie in the range between Vmin and V11 246.

If the final terminal voltage Vf exceeds the minimum voltage threshold Vmin and the predetermined voltage threshold V11, then the microprocessor compares the final terminal voltage Vf against a second predetermined voltage threshold V12 248. If the final terminal voltage Vf lies between the first predetermined voltage threshold Vmin and the second predetermined voltage threshold V12, then the microprocessor may determine the voltage rating of the battery corresponds to a battery with a voltage that would lie in the range between V11 and V12 250 If the final terminal voltage Vf exceeds the second predetermined threshold V12, then the microprocessor may determine that the voltage rating of the battery corresponds to a battery with a voltage that would lie in the range between V12 and Vmax 252.

Figure 3:
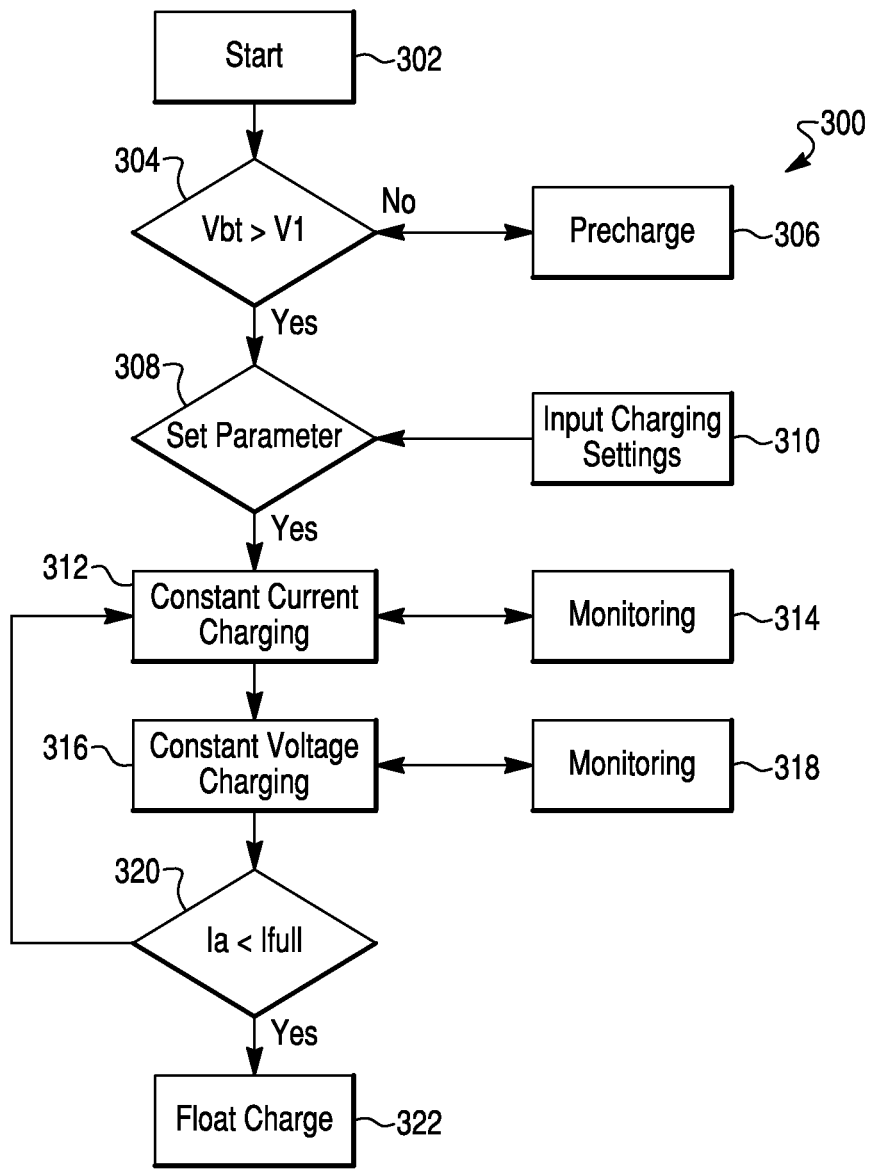
FIG. 3 is a flowchart of a third method for an auto-voltage detect charger.

FIG. 3 is a flowchart of a third method for an auto-voltage detect charger. The method 300 may begin 302 after the voltage rating of a battery is determined by a microprocessor (MCU) of an auto-voltage detect system. In step 304, the terminal voltage of a battery Vbt is compared to a predetermined voltage threshold V1. The predetermined voltage threshold V1 may be set to determine whether a battery is ready to be charged, or whether the battery needs to run through the precharge phase 306. V1 may be predetermined based at least in part on the voltage rating of the battery to be charged, which may be automatically determined through method 200. In one embodiment, V1 is set to 5V for a 6V battery rating. In other embodiments, V1 may be set to 10V for a 12V battery rating, or V1 may be set to 20V for a 24V battery rating.

If the terminal voltage of the battery Vbt does not exceed the predetermined voltage threshold V1, then the battery charging may be suspended, and the battery may enter the precharge phase 306. The precharge phase 306 can help to stabilize the battery status and prepare the battery for charging and analysis.

If the terminal voltage of the battery Vbt exceeds the predetermined voltage threshold V1, then the MCU sets one or more battery charging parameters 308. The one or more battery charging parameters may be determined based at least in part on charging settings 310 received from manual input. Charging settings can include a battery type (i.e. battery chemistry) and/or a battery charging rate. For example, the battery type, or chemistry, may be lead acid, gel, or absorbed glass mat (AGM). The charging rate may be low, medium, or high. The charging settings may be specified 310 through a keypad input, or through other manual input methods, such as buttons, toggles, and/or switches.

After the MCU determines or sets the charging parameters 308, the battery charger enters constant current charging mode 312. Constant current charging mode 312 may comprise a "bull charging mode." During constant current charging mode, various characteristics of the battery are monitored 314, such as the temperature of the battery and the voltage of the battery.

Once the voltage of the battery arrives at a predetermined level the charging mode will switch from constant current charging 312 to constant voltage charging 316. The charging voltage of the constant voltage charging mode 316 may be predetermined based on the type of battery. For example, the charging voltage may be set to 14.4V for a flood battery, 14.0V for a gel battery, and 14.6V for an AGM battery.

During constant voltage charging 316, the current of the battery Ia may be monitored 318. If the battery current drops below the full current setting 320, the battery may go into a float charge mode 322. The float charge mode 322 may represent the fact that the battery is fully charged. The float charge mode 322 may comprise a battery maintenance mode.

Figure 4:
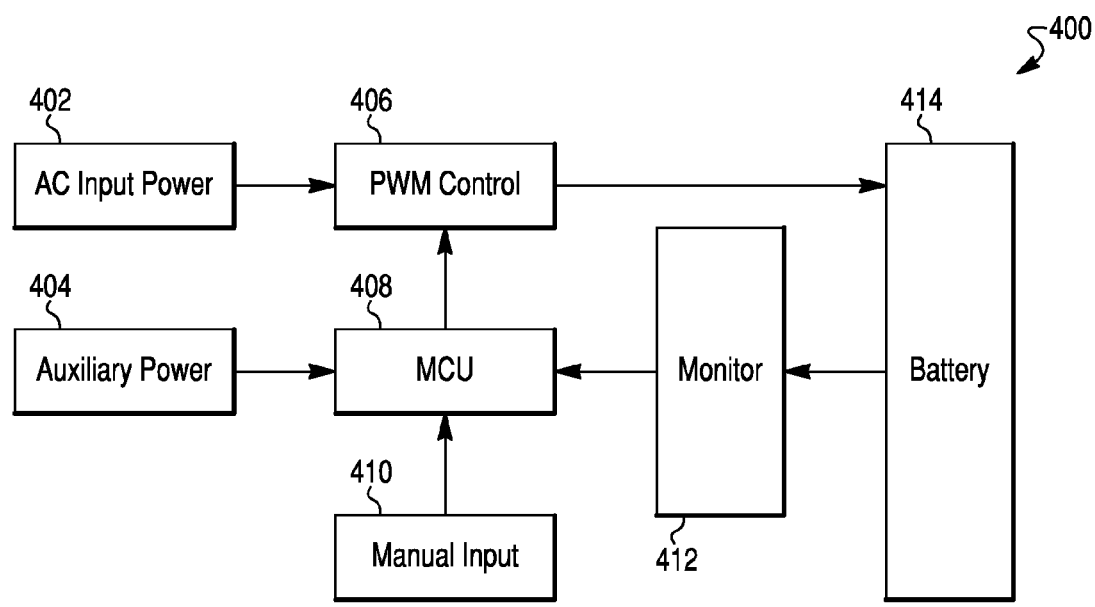
FIG. 4 is a block diagram of a system for auto-voltage detect charger.

FIG. 4 is a block diagram of a system for auto-voltage detect charger. As shown in FIG. 4, the system 400 comprises AC input power 402, auxiliary power 404, pulse width modulation (PWM) control 406, microprocessor control unit (MCU) 408, manual input 410, monitor 412, and battery 414.

Power from the AC input power 402 may be transformed via a high frequency voltage transformer.

MCU 408 may comprise a device capable of executing computer-executable program instructions. Such microprocessors may include one or more microprocessors, ASICs, and state machines. Such processors may further comprise programmable electronic devices such as PLCs, programmable interrupt controllers (PICs), programmable logic devices (PLDs), programmable read-only memories (PROMs), electronically programmable read-only memories (EPROMs or EEPROMs), or other similar devices. Such processors include, or can be in communication with, media which stores instructions that when executed by the processor, cause the processor to perform the steps described herein. Embodiments of computer-readable media include, but are not limited to, an electronic, optical, magnetic, or other storage or transmission device capable of providing a processor with computer-readable instructions. Other examples of suitable media include, but are not limited to, a floppy disk, CD-ROM, DVD, magnetic disk, memory chip, ROM, RAM, an ASIC, a configured processor, all optical media, all magnetic tape or other magnetic media, or any other medium from which a computer processor can read instructions. Also, various other forms of computer-readable media can transmit or carry instructions to a computer, including a router, private or public network, or other transmission device or channel, both wired and wireless. The instructions can comprise code from any suitable computer-programming language, including, for example, C, C+, C++, Visual Basic®, Java™, Python™, and JavaScript®.

The MCU 408 may comprise a single chip microprocessor configured to control operation of the charger. The MCU 408 may comprise two timers, and two groups of input/output (I/O) ports. Additionally, the MCU 408 may include an 8-bit analog to digital (A/D) converter and a 7-bit digital-to-analog (D/A) converter. By having a pair of timers, ports, and converters, the MCU 408 may be more economical and efficient than other MCUs.

The MCU 408 can be configured to control output voltage through PWM control 406. PWM control 406 may utilize high-frequency switch power technology. The MCU 408 may receive various charging parameters through manual input 410. In some embodiments, manual input 410 comprises a keypad. The keypad may be configured to input parameters such as the charging speed (e.g. slow, medium, or fast) or type of battery (e.g. gel, lead-acid, or gel).

The monitor 412 can be configured to monitor various characteristics of the battery 414 before, during, and after voltage detection and/or charging. The monitor 412 may measure or monitor battery characteristics such as the terminal voltage of the battery 414, the current produced by the battery 414, and the temperature of the battery 414.

Figure 5:
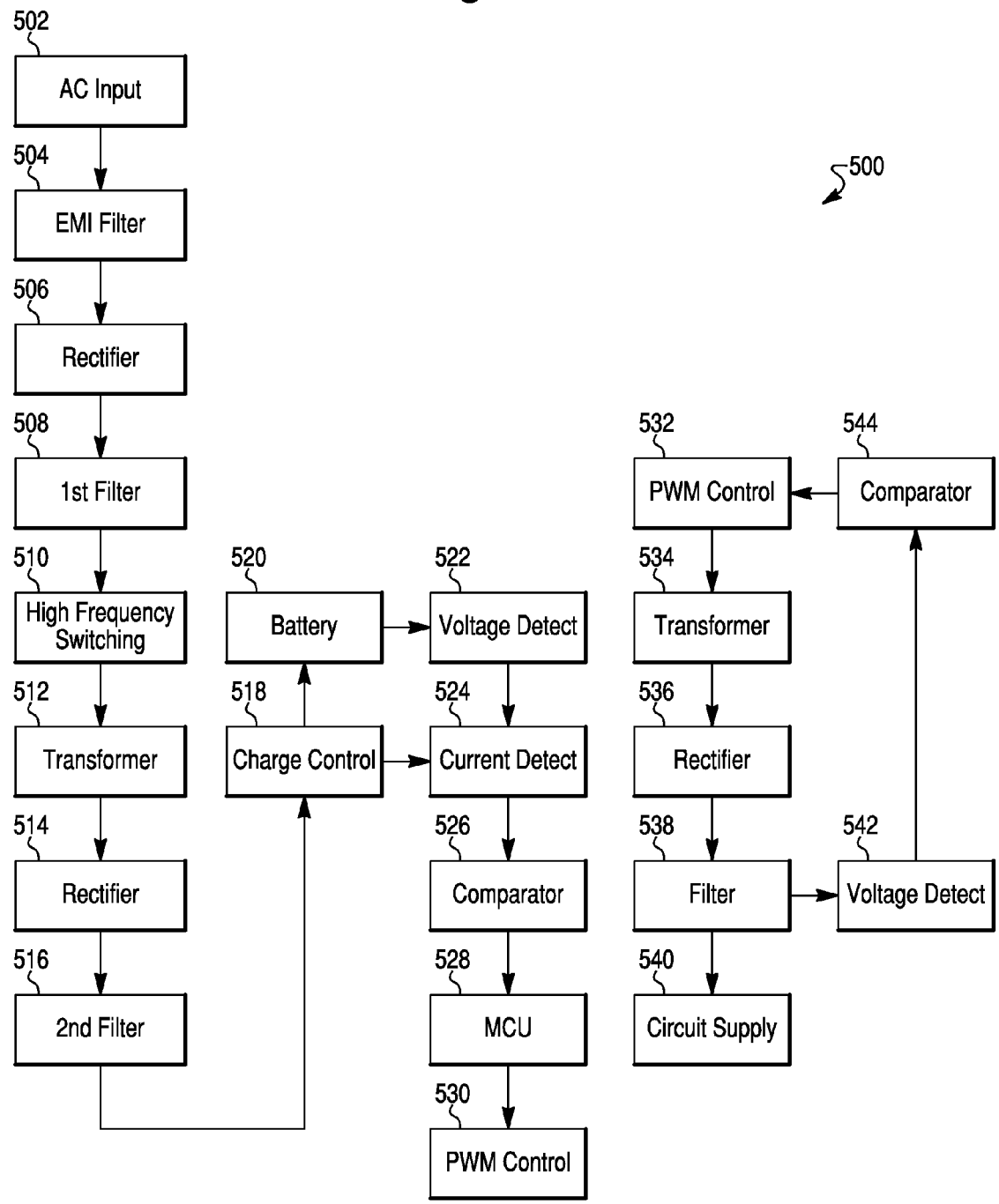
FIG. 5 is a block diagram of a system for auto-voltage detect charger.

FIG. 5 is a block diagram of a system for auto-voltage detect charger. The system 500 illustrated in FIG. 5 shows one embodiment of a hardware design functional block diagram. The system 500 adopts high-frequency switch power technique and converts alternating current (AC) to direct current (DC). The main power circuit is controlled by a first microprocessor U1, which provides the battery charging power. Another PWM circuitry is controlled by a second microprocessor U2, which functions to provide auxiliary power to control the Integrated Circuits, MCU, and ventilation fan.

As shown in FIG. 5, the system 500 comprises AC input 502, EMI filter 504, rectifier 506, $1^{st}$ filter 508, high frequency switching 510, transformer 512, rectifier 514, $2^{nd}$ filter 516, charge control 518, battery 520, voltage detect 522, circuit detect 524, comparator 526, MCU 528, and PWM control 530. The system 500 further comprises PWM control 532, transformer 534, rectifier 536, filter 538, circuit supply 540, voltage detect 542, and comparator 544.

The product adopts high-frequency switch power technique and converts AC input 502 to DC. The system 500 comprises two PWM control circuitries 530, 532. The main power circuit and the first PWM control 530 is controlled by a first microprocessor MCU 528, which provides the battery charging power.

A second microprocessor is configured to control the second PWM control 532. The second PWM control can be configured to provide the auxiliary power (+5V DC, +40V DC) to control integrated circuits, a microprocessor, and/or a ventilation fan.

Figure 6:
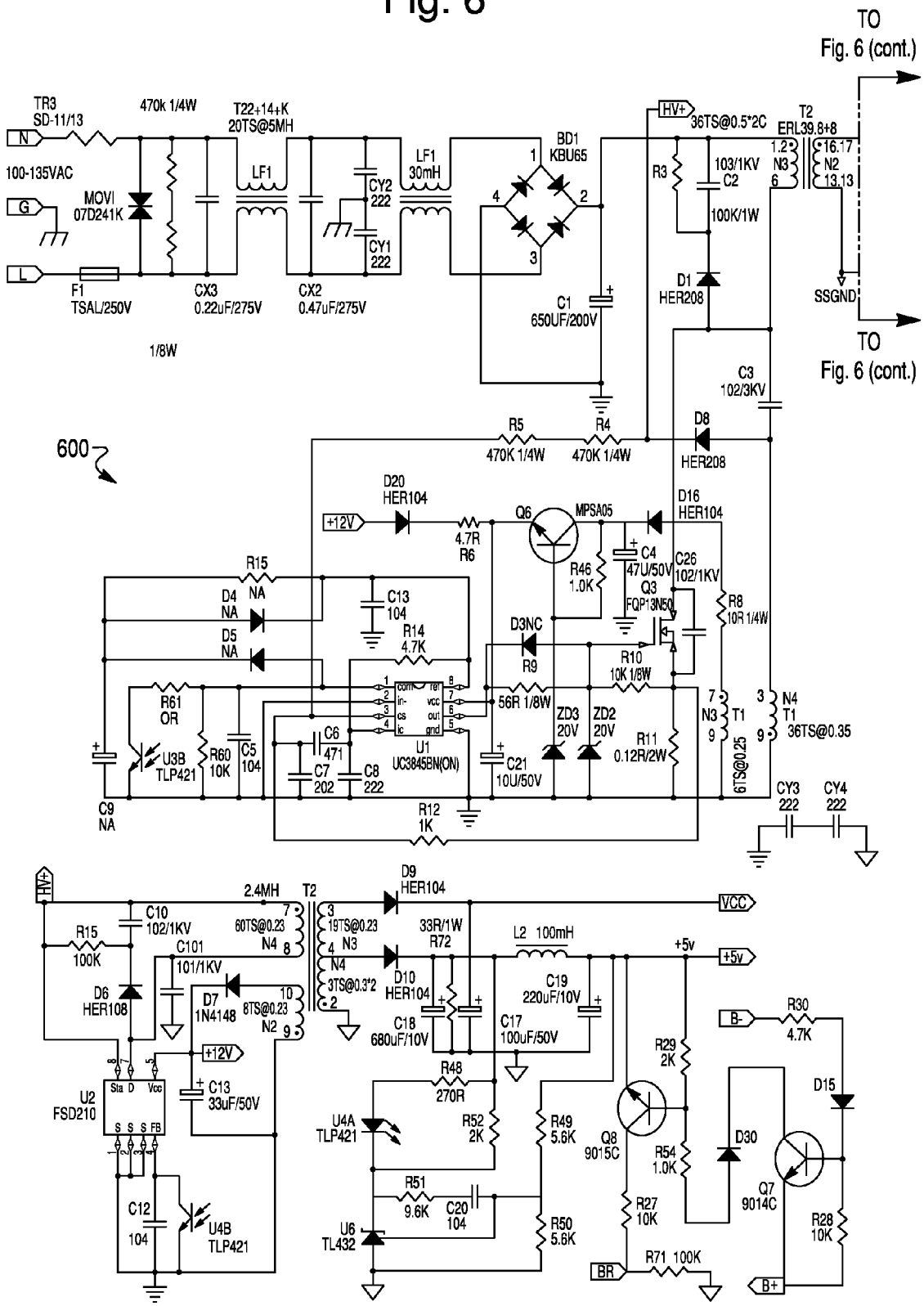
FIG. 6 is a circuit diagram of a system for auto-voltage detect charger.
Figure 6:
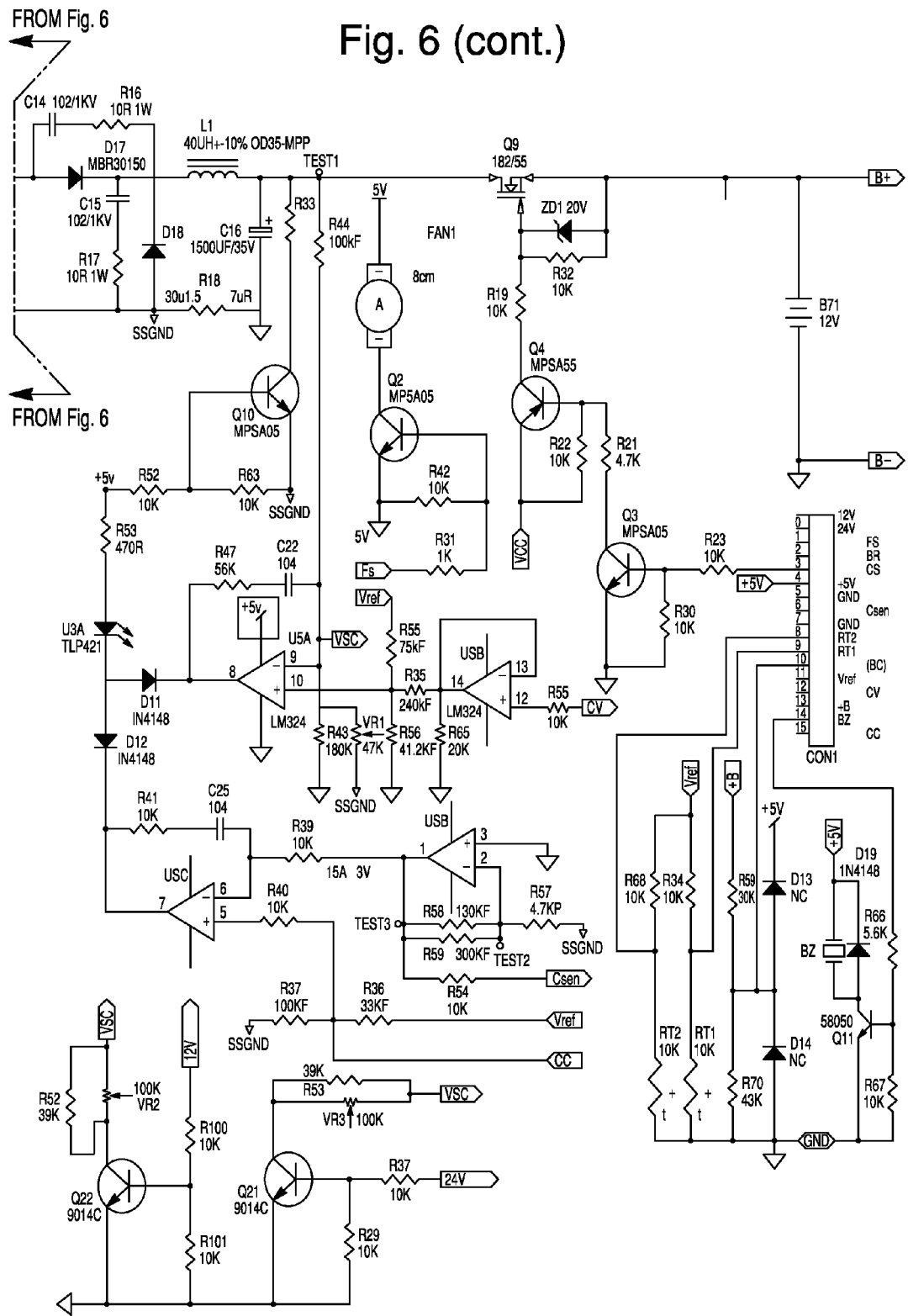

FIG. 6 is a circuit diagram of a system for auto-voltage detect charger. The system 600 can be configured to automatically control some or all of the operation of the auto-voltage detect charger. In some embodiments, various charging characteristics may be specified. As one example, different charging rates, such as low, medium and high, may be selected. As another example, the type of battery, such as gel, lead acid, or AGM, may be selected in order to adopt the best charging characteristic.

The system 600 may be configured to monitor the battery status (i.e. configured to monitor various characteristics of the battery), such as the battery voltage, battery current, and/or battery temperature. The system 600 may monitor characteristics of the battery in real time, and report the condition and/or characteristics of the battery on a display. By continuously monitoring one or more characteristics of the battery, the system 600 may also control for various charging errors, such as short circuit, overload, overheat, reverse connection, etc.

The system 600 may also be configured to control charging of the battery through different charging stages according to the condition and/or measured characteristics of the battery. The different charging stages may include an initiation stage, a bulk charge (constant current) stage, a top off (constant voltage) stage, and a float charge stage. The different charging stages facilitate quick and efficient battery charging.

Figure 7:
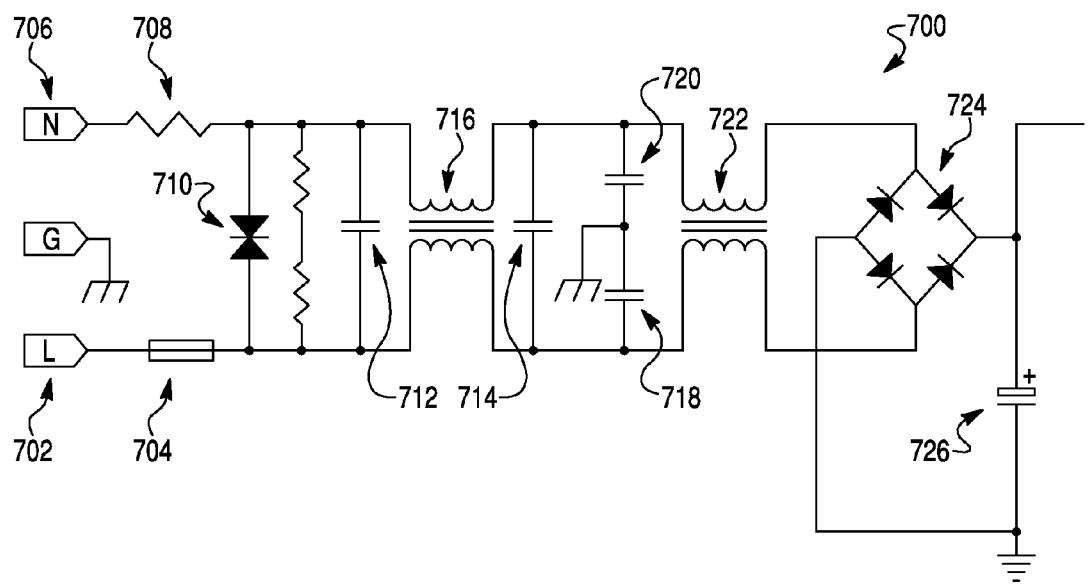
FIG. 7 is a first aspect of the circuit diagram of FIG. 6.

FIG. 7 is a first aspect of the circuit diagram of FIG. 6. The system 700 illustrated in FIG. 7 comprises AC input 702, fuse 704, input N, thermal resistor 708, and transient voltage suppression diode 710. AC voltage 702 is provided through fuse 704. Input 706 is connected with thermal resistor 708 and in parallel with transient voltage suppression diode 710 to AC input 702. Thermal resistor 708 can be configured to provide protection to the circuit. Under a 'cold condition,' thermal resistor 708 can be configured to reduce the power of a startup surge current. Under an overvoltage condition, transient voltage suppression diode 710 will become shorted or fuse 704 will blow in order to protect the secondary circuitry.

The system 700 further includes capacitor 712, capacitor 714, transformer 716, capacitor 718, capacitor 720, and transformer 722. Capacitor 712 and Capacitor 714 comprise a differential mode noise filter. Capacitor 712, transformer 716, capacitor 714, capacitor 718, capacitor 720, and transformer 722 form a low pass filter configured to filter out high frequency noise from the power line. Capacitor 720, Capacitor 722, Transformer 716, Transformer 722, an additional transformer (not shown in FIG. 7), and two additional capacitors (not shown in FIG. 7) comprise a common mode noise filter, which is configured to suppress the common mode noise.

Additionally, as shown in FIG. 7, bridge type rectifier 724 can be configured to convert the AC voltage to full wave DC voltage. Polarized capacitor 726 can be configured to filter and smooth the wave shape DC voltage into a flat DC supply and provide the flat DC supply to connected circuitry.

Figure 8:
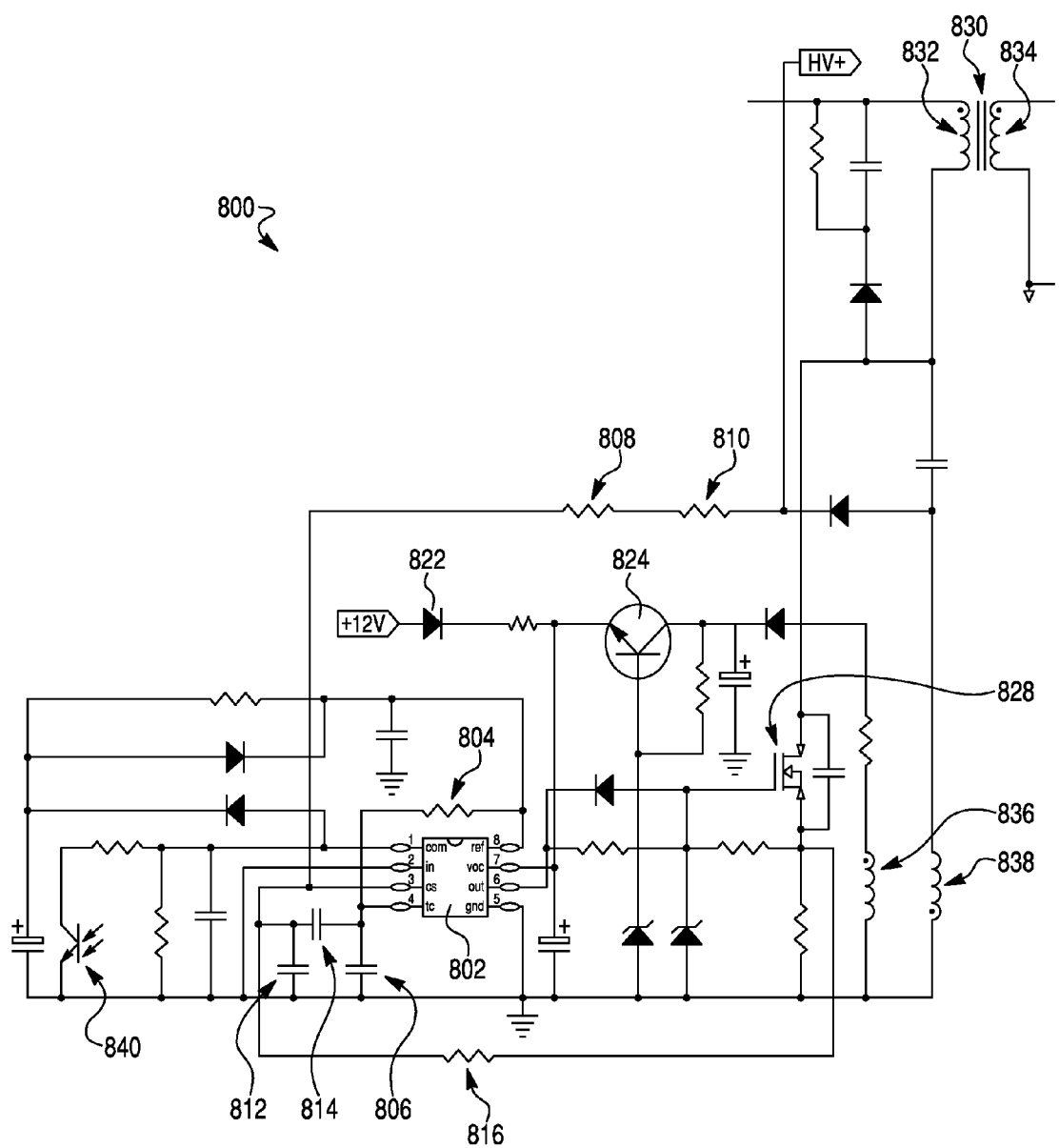
FIG. 8 is a second aspect of the circuit diagram of FIG. 6.

FIG. 8 is a second aspect of the circuit diagram of FIG. 6. As shown in FIG. 8, the system 800 comprises a microprocessor unit (MCU) 802. The MCU 802 comprises 8 input pins: pin 1 "com", pin 2 "in-", pin 3 "cs", pin 4 "rc", pin 5 "gnd", pin 6 "out", pin 7 "vcc" and pin 8 "ref." The MCU 802 begins operation when input pin 7 vcc, receives power from a diode.

Resistor 804 and Capacitor 806 form a resistor-capacitor oscillator (RC oscillator) with a 67 kHz frequency for MCU 802 oscillator circuitry. Pin 6 out of MCU 802 outputs a pulse width modulation signal to transistor 828. Transistor 828 forms the switching network through the coil rectifier 830 of transformer 830.

Transformer 830 comprises four coil rectifiers 832, 834, 836, and 838. Coil rectifiers 834, 836 of transformer 830 will generate power with the switching AC network in coil rectifier 832. Coil rectifier 836 will then provide the regulated, stable voltage supply Vcc to MCU 802 through transistor 824, which no longer requires the Aux. supply from MCU 1002 (shown in FIG. 10).

The output voltage is compared to Vref and the result is feedback to MCU 802 pin 1 through 920 and transistor 840. MCU 802 will generate the PWM signal from pin 6 and control transistor 828 on/off timing for the proper voltage regulate purpose. Current sensing signal will pass through 922, which in turn controls 920 and provides feedback to pin 1 of MCU 802, which controls 828 on/off timing to establish a proper output level to keep the current required.

Resistor 808, resistor 810, capacitor 812, capacitor 814, and resistor 816 form a current detect circuitry, which protects the charger from overload condition. The system may also avoid peak surges through transformer 820.

Figure 9:
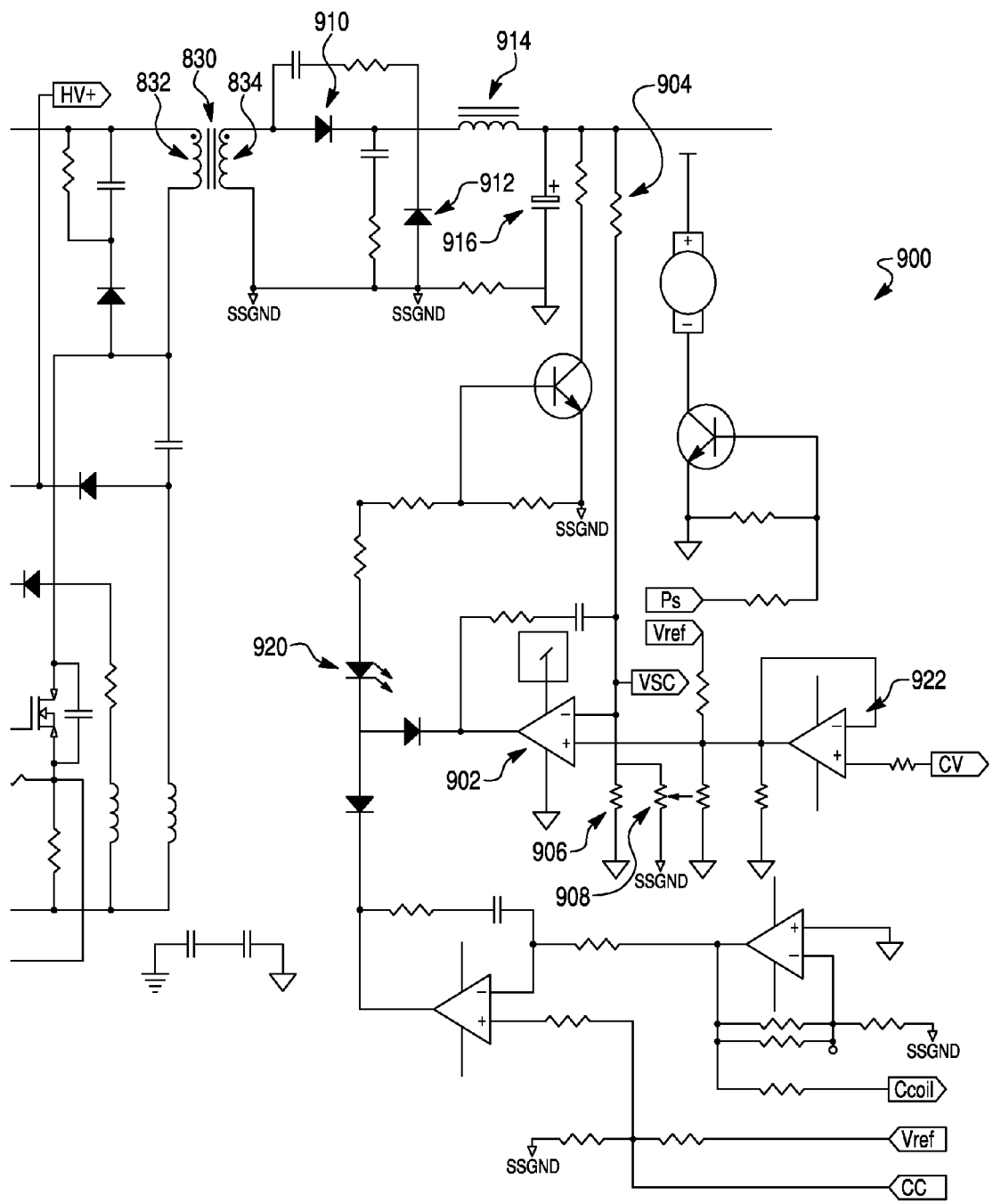
FIG. 9 is a third aspect of the circuit diagram of FIG. 6.

FIG. 9 is a third aspect of the circuit diagram of FIG. 6. As shown in FIG. 9, the system 900 comprises amplifier 902 and Light Emitting Diode (LED) 920. A current sensing signal will pass through amplifier 902, which in turn controls LED 920 and feedback to pin 1 of MCU 802. MCU 802 can then control on/off timing to establish a proper output level to maintain the required current.

Coil rectifier 834 will provide the main power supply to filter network diode 910, diode 912, inductor 914 and capacitor 916, which then provides the DC supply to charger on/off control transistor 1104 (shown in FIG. 11). 902 will get the output voltage sampling through resistor network 904, 906 and variable resistor 908.

Figure 10:
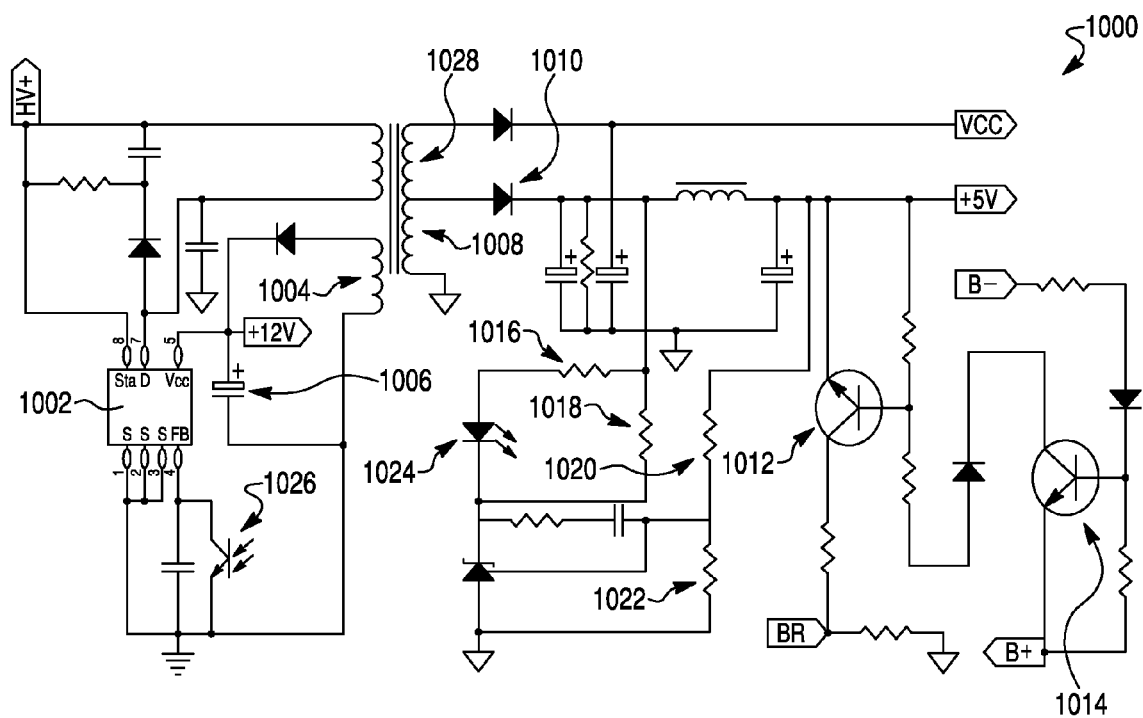
FIG. 10 is a fourth aspect of the circuit diagram of FIG. 6.

FIG. 10 is a fifth circuit diagram of an aspect of a system for auto-voltage detect charger. The system 1000 shown in FIG. 10 comprises a microprocessor 1002, inductor 1004, capacitor 1006, coil rectifier 1008, diode 1010, transistor 1012 and transistor 1014. Voltage is supplied through coil rectifier 1008 through diode 1010 to provide a clean and regulate +5V power supply for microprocessor 1002.

Resistor 1016, resistor 1018, resistor 1020, resistor 1022, and diode 1024 form the voltage sample and feedback the output status to microprocessor 1002 through diode 1024 and transistor 1026. Then microprocessor 1002 will generate the PWM pulse signal to control the output voltage forming a feedback loop. Coil rectifier 1028 supplies the regulated DC bias voltage to 1104 for on/off control.

Upon AC power up, rectifier voltage output fed to pin 8 of microprocessor 1002, which starts the switching operation. Inductor 1004 provides switching voltage through capacitor 1006 for a regulated voltage Vcc to pin 5 of microprocessor 1102. As shown in FIG. 8, the regulated 12V is also fed to the MCU 802 for Vcc supply. The regulated 12 v is provided to the MCU 802 via pin 7 through diode 806 and resistor 804.

The system 1000 also comprises reverse protection circuitry for the charger. Transistor 1014 can detect a reverse connection and turn on transistor 1012, which then provides an active high signal to a microprocessor through BR. In response, the microprocessor will not turn on output. Additionally, the microprocessor may generate an alarm signal by activating a buzzer.

Figure 11:
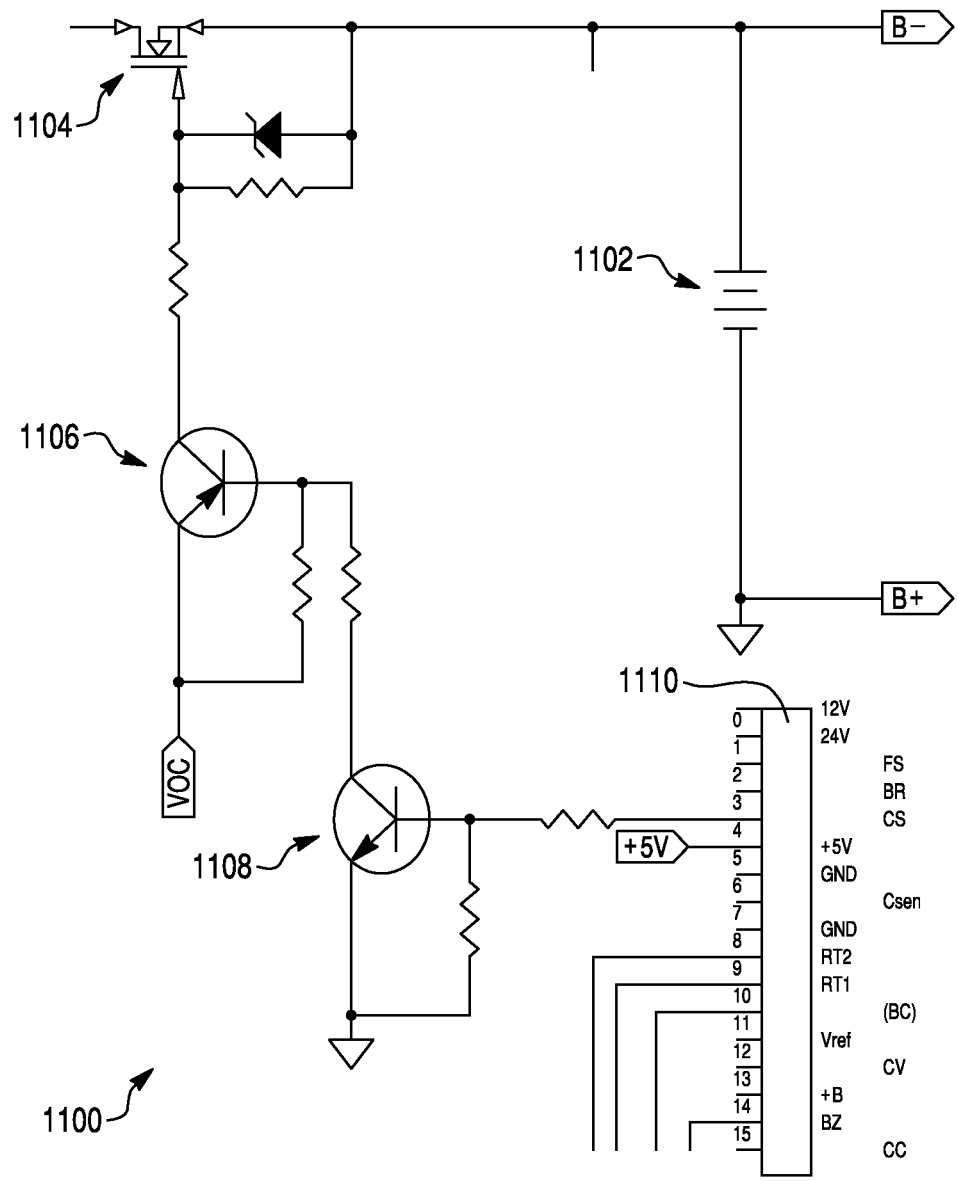
FIG. 11 is a fifth aspect of the circuit diagram of FIG. 6.

FIG. 11 is a sixth circuit diagram of an aspect of a system for auto-voltage detect charger. As shown in system 1100, a battery 1102 is engaged by the battery charger. Charging control 1104 switches battery charging on and off. The microprocessor 1110 regulates charging control 1104 through transistor 1108 and transistor 1106. When 1104 is turned on, the main power circuit can deliver power to the battery 1102 and start or continue the charging process.

Figure 12:
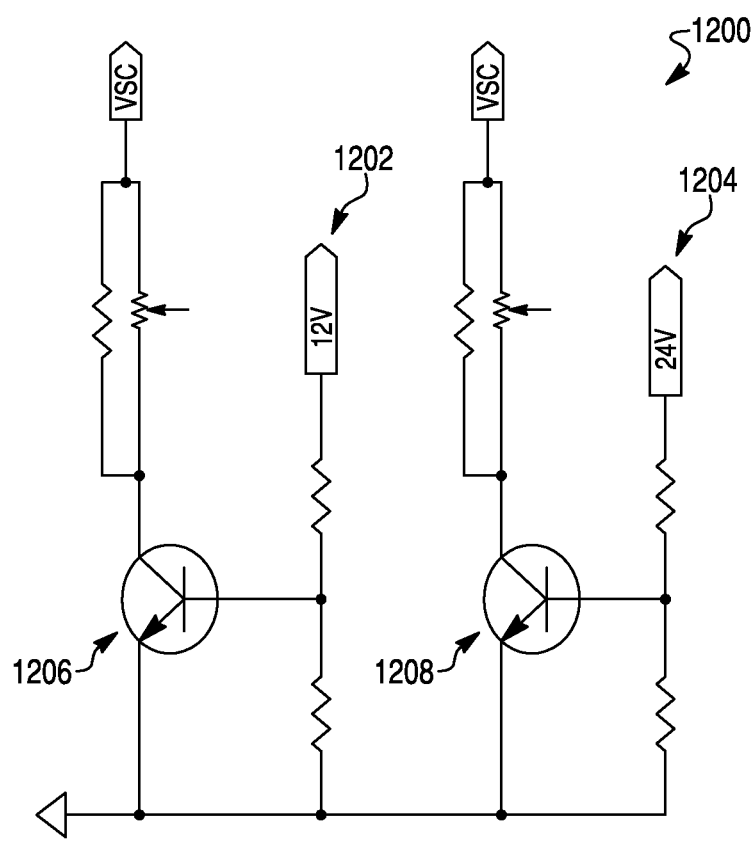
FIG. 12 is a sixth aspect of the circuit diagram of FIG. 6.

FIG. 12 is a seventh circuit diagram of an aspect of a system for auto-voltage detect charger. As shown in FIG. 12, the system 1200 comprises a first voltage reference 1202 and a second voltage reference 1204. The voltage references 1202, 1204 (i.e. Vref) can provide a reference voltage for a sampling voltage comparison. In some embodiments, the voltage reference for charging a battery should vary according to the voltage rating of the battery. For example, while a 6V, 12V or 24V battery is charged, the selected voltage reference varies according to the voltage rating of the battery. A microprocessor (not shown in FIG. 12) may select the appropriate voltage reference after the battery voltage is detected. As shown in FIG. 12, the microprocessor may select the appropriate voltage reference from voltage reference 1202 or voltage 1204, and turn off the opposite transistor 1208 or 1206.

Transistor 1206 and transistor 1208 can provide a voltage shunt (i.e. Vsc) in parallel to the sample voltage and conduct the needed voltage reference Vref. The appropriate voltage reference can work in the voltage feedback control to the PWM control circuitry. The microprocessor will generate the necessary constant voltage (i.e. CV) signal and select the reference voltage to achieve the constant voltage control.

Figure 13:
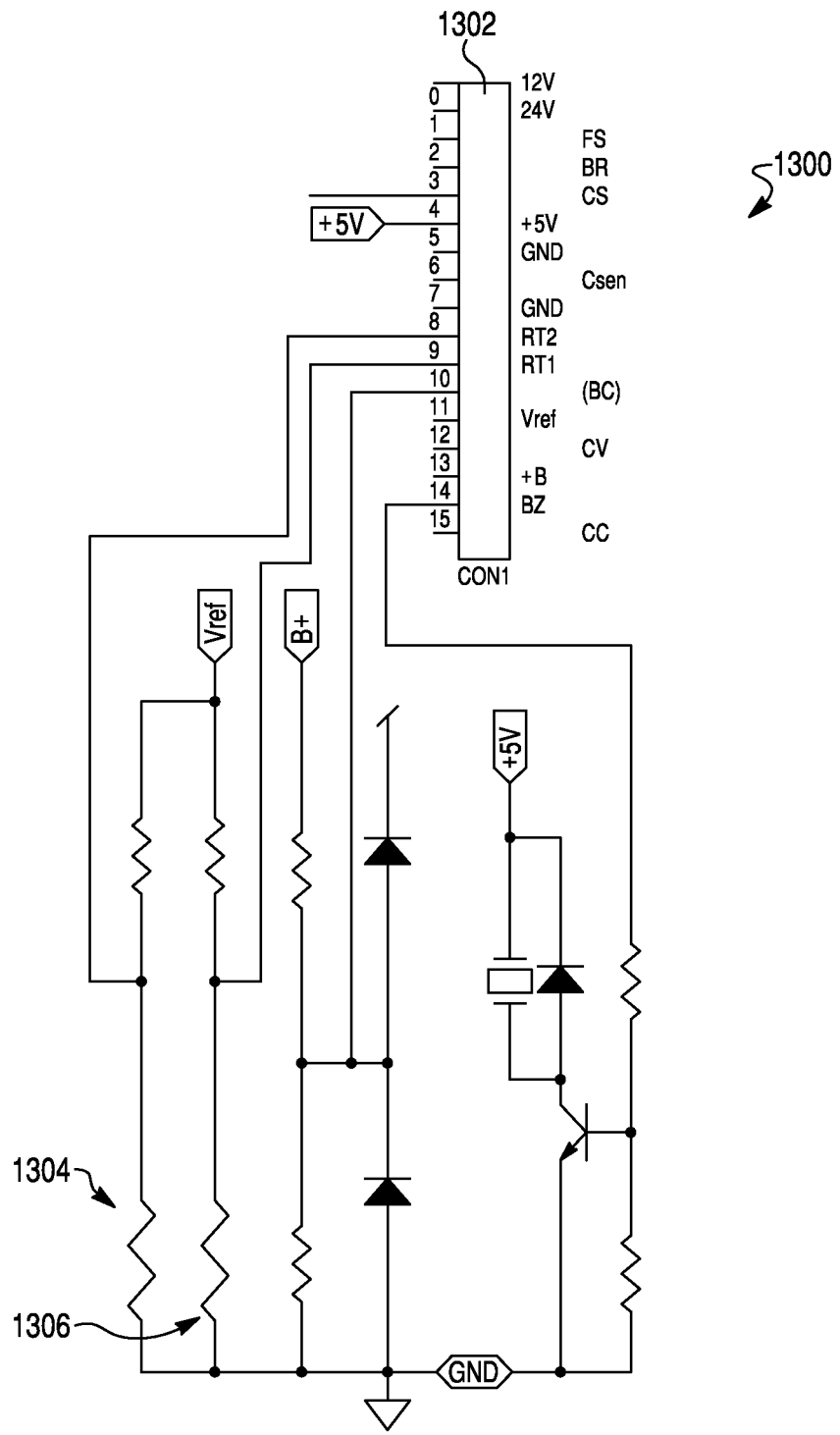
FIG. 13 is a seventh aspect of the circuit diagram of FIG. 6.

FIG. 13 is an eighth circuit diagram of an aspect of a system for auto-voltage detect charger. As shown in FIG. 13, the system 1300 comprises a microprocessor 1302. The microprocessor 1302 is in communication with a first temperature sensor 1304 and a second temperature sensor 1306. In other embodiments, the system 1300 may comprise zero, one, three, or more temperature sensors.

The first temperature sensor 1304 may comprise an environmental temperature sensor. An environmental temperature sensor can be configured to convert the temperature to a voltage signal. The microprocessor 1302 may receive the voltage signal based on the and compensate the voltage deviation on battery according to different temperature measurements.

The second temperature sensor 1306 may be configured to detect overheating inside the battery charger. The microprocessor 1302 may receive signals from the second temperature sensor 1306 and control operation of the charger. In some embodiments, the microprocessor 1302 may control a fan based on signals received from the second temperature sensor 1306. Or, the microprocessor 1302 may stop the charging process.

In one scenario, the battery charger may overheat due to an abnormal condition, such as battery failure, or a charger malfunction. The first temperature sensor 1304 and/or the second temperature sensor 1306 may detect an abnormal temperature, and communicate with the microprocessor 1302. The microprocessor 1302 then transmits a fan control signal to reduce the internal temperature, or alternative, shuts down the battery charger.

Figure 14:
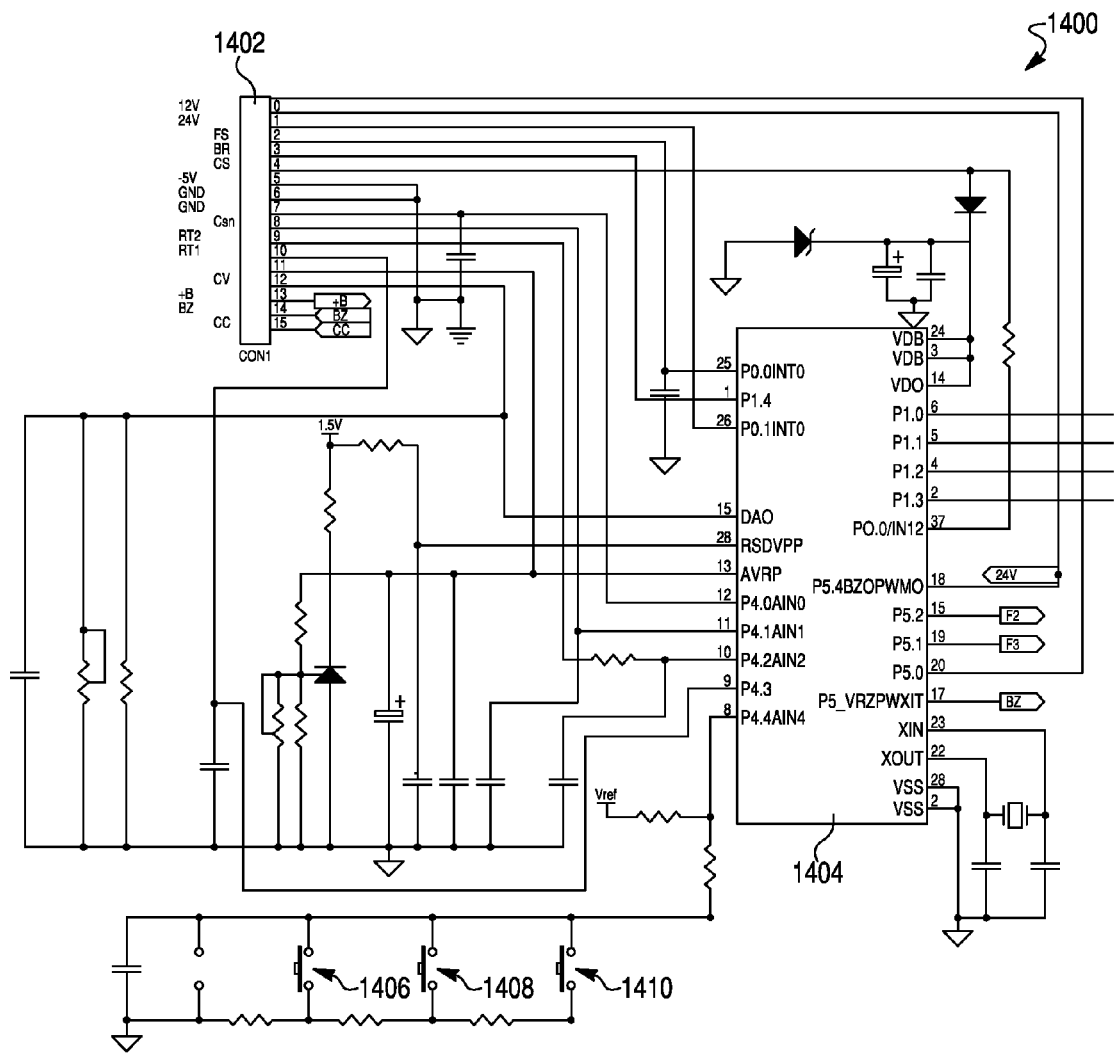
FIG. 14 is an eighth aspect of the circuit diagram of FIG. 6.

FIG. 14 is a ninth circuit diagram of an aspect of a system for auto-voltage detect charger. The system 1400 illustrated in FIG. 14 comprises a first microprocessor 1402 and a second microprocessor 1404. In the embodiment shown in FIG. 14, the second microprocessor 1404 forms the control center of the charger.

Each microprocessor 1402, 1404 comprises a plurality of input pins. The second microprocessor 1404 comprises a pin configured to receive input from one or more manual input devices, such as a keypad, button, toggle, or switch. The system 1400 comprises a first switch 1406, a second switch 1408, and a third switch 1410 in communication with the second microprocessor 1404. Each switch 1406, 1408, and 1410 may comprise a manual input. Switch 1406 may comprise a manual input for battery type. Switch 1408 may comprise a manual input for charge rate. Switch 1410 may comprise a start/stop or on/off manual input. In other embodiments, other parameters for voltage detection and/or charging may be manually specified.

The second microprocessor 1404 may also comprise one or more input/output control signals. The various control signals may control for 12/24 volts, a reference voltage, fan control, output, reverse connection, constant voltage mode, constant current mode, voltage sampling, current sensing, and buzzer control.

The second microprocessor 1404 can be configured to be in communication with a display (not shown in FIG. 14). In some embodiments, the second microprocessor 1404 may comprise a display control. The display control may receive information based on the charger or battery status, and generate a visual indication shown on the display. For example, the second microprocessor 1404 may monitor the terminal voltage of the battery, and generate a visual indication representing a fully charged battery to be shown on the display.

Systems and methods for an auto-voltage detect charger may have various advantages over conventional methods for battery charging. Embodiments of the auto-voltage detect charger may be configured to automatically detect the voltage of batteries with various voltages, for example, ranging from 6V batteries to 72V batteries. In addition, embodiments of the auto-voltage detect charger may quickly and efficiently charge batteries to their full capacity.

As described above, the invention device is an automatic charge control with linear transformer battery charger. As described below, the preferred embodiment is shown and described with reference to FIGS. 15-19. The preferred embodiment uses an 8 bit controller to regulate the turn on angle for SCR (Silicon Control Rectifier), in such case to control the output voltage and current. With the intelligent software and hardware design, the charger can automatically detect voltage range for most car batteries type and other batteries, which do not need users to select the voltage and avoid mis-operation of selection that cause failure of charging process.

Figure 15:
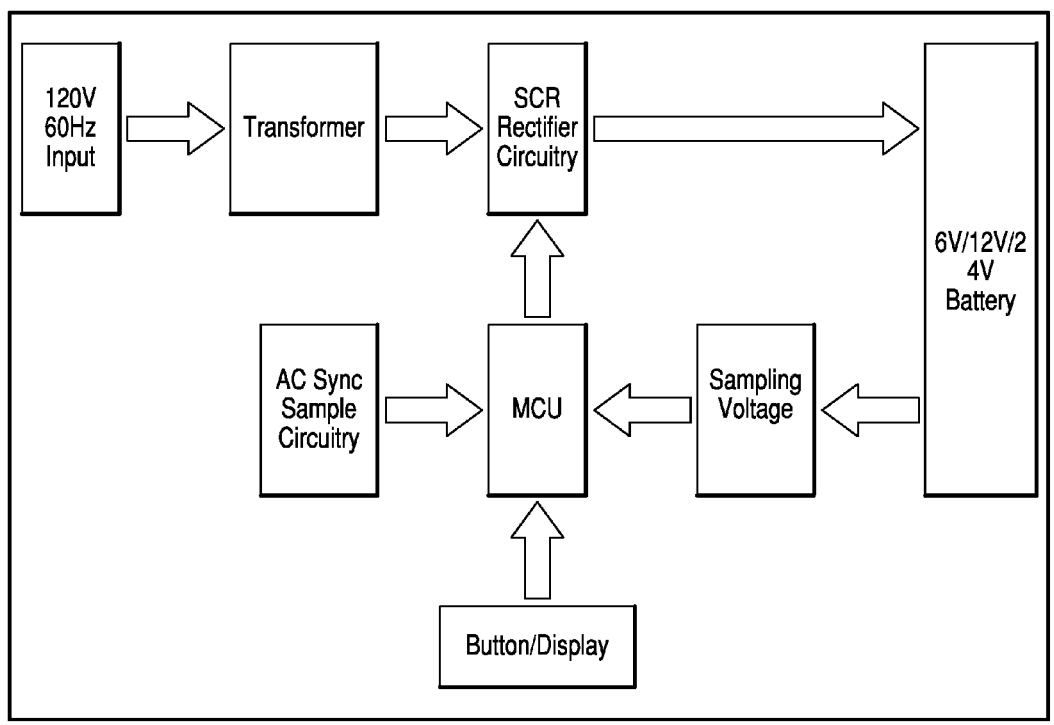
FIG. 15 is a schematic of the system design according the preferred embodiment of the present invention.

With reference to FIG. 15, the charger automatically controls most of the operation, monitor the battery status and charge with different stage according to the condition. With the real time monitor, reporting different status and condition on panel display. Different charging rate of low, medium and high is selectable with different battery capacity. Also offer the choice for different batteries type like Gel, Standard lead acid, AGM to adopt the best charging characteristic. In the preferred embodiment of FIGS. 15-19, the battery voltage detection system follows the following general procedure:

1. Apply a first precharge with a 2 amp constant current for approximately 120 seconds, then stop the charge for approximately 30 seconds.
2. Apply a second precharge with a 2 amps constant current for approximately 120 seconds, then stop the charge for approximately 30 seconds.
3. Apply a third precharge with a 2 amp constant current for approximately 120 seconds, then stop the charge for approximately 30 seconds.
4. Actively discharge for approximately 30 second (i.e., resistor discharge), then check for a faulty battery (e.g., open cell so the battery voltage drops fast).
5. Apply a fourth precharge with a 2 amp constant current for approximately 120 seconds, then stop the charge for approximately 30 seconds.
6. Begin battery detection and predict battery voltage type/level.

Different charging stage for initiation, bulk charge (constant current), tap off (constant voltage) and float charge can guarantee that the battery is in the best state of charging. The invention of automatic recognition of battery voltage type (6V/12V/24V) can further reduce the manual operation and ease of operation.

Figure 16:
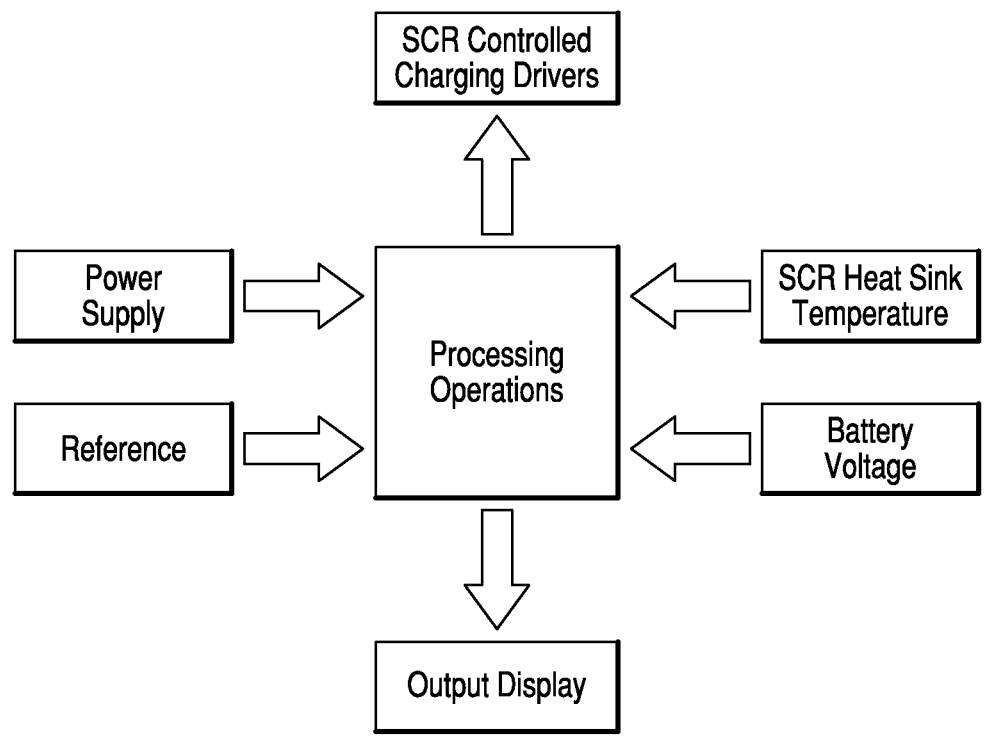
FIG. 16 is a block diagram of the functional aspects of the software employed by the present invention.

FIG. 16 is the MCU firmware functional block. The core processing unit controls the battery charging current/voltage according to different information received from different units. The CPU also sent out control result and charger status to the display unit and feedback to user operation.

Figure 17:
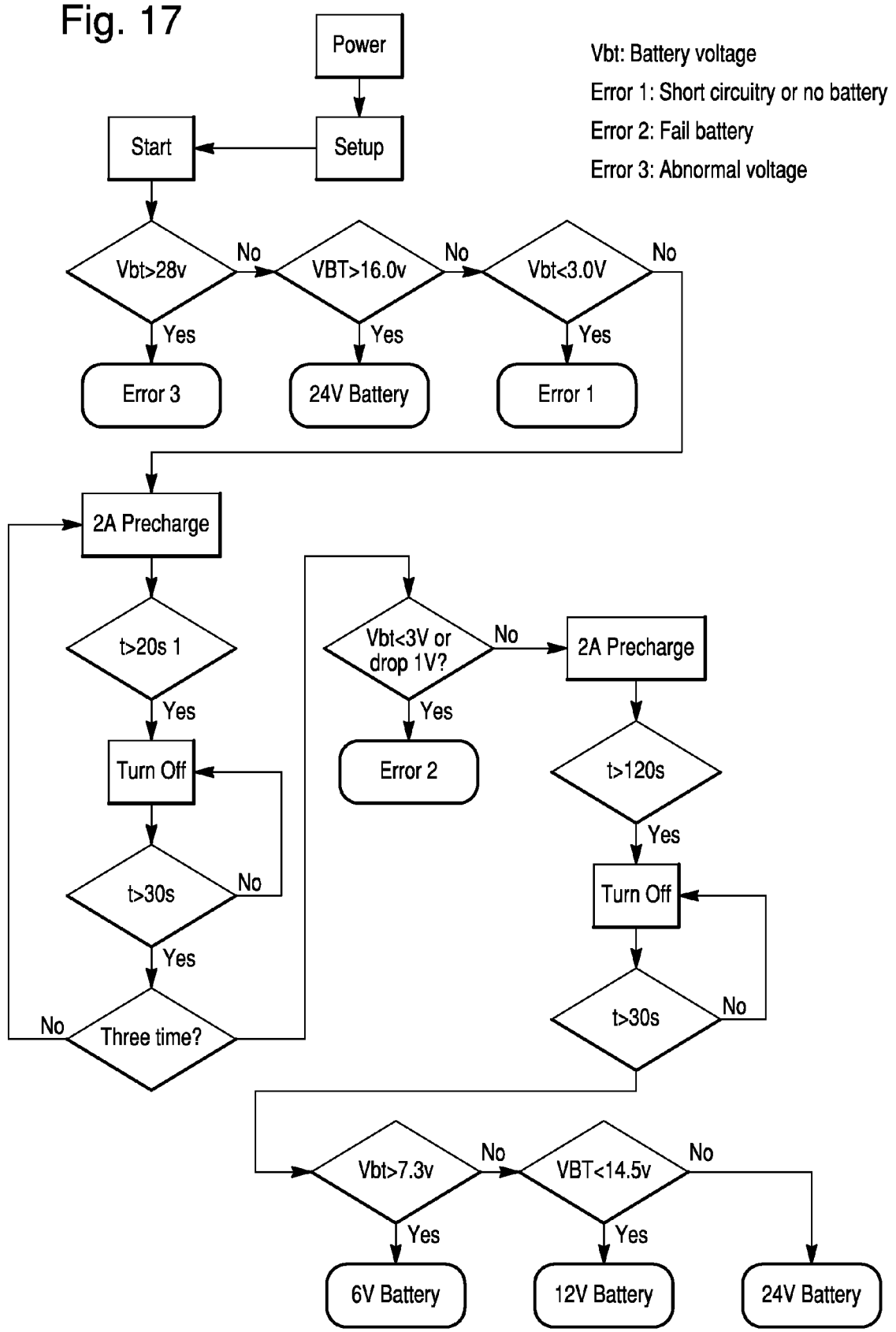
FIG. 17 is a software design flowchart for battery recognition according the preferred embodiment of the present invention.

With reference to the software design flowchart for battery voltage recognition of FIG. 17, the charger differentiates batteries for 6V, 12V and 24V automatically and does not need manual selection. The principle of the invention adopts intermittence charging. In the beginning of charging charge up battery with small startup current, then stop charge for battery stabilize, and recharge the battery for battery terminal voltage detection. With the monitoring of battery terminal voltage Vbt, the rising speed of battery voltage can provide information of the battery type.

Upon startup, the MCU enters the initialization state. Clear and setup memory, initial timer value, set up the corresponding state of each I/O port. The system monitors input keypad and starts detection of current, voltage and temperature sensor.

According to the voltage detect value Vbt, the charger predict:
Vbt>28V: Error mode
28V>Vbt>14.5V: 24V battery
3.0V>Vbt: Error mode or no battery The charger will go into a 2 A precharge stage for 120 seconds, then stop for 60 seconds. The battery will settle down will this start up charge current, then the charger will re-start the 2 A charging process for other cycles. According to the preferred embodiment, there are a total of 3 cycles.

After the charge up stage, the invention will proceed for the next stage of fail battery detect as illustrated in FIG. 17, whereby:
3.0V>Vbt
Or a drop of >1V for Vbt (indicates an error mode means for dead cell battery or dead battery.)

The system then proceeds for another 120 second charge and 60 second stop cycle.

Then, the system will start the battery voltage Vbt detection for prediction, whereby:
3.0V<Vbt<7.5V: 6V battery
7.5V<Vbt<14.5V: 12V battery
Vbt>14.5V: 24V battery.

With the succession of battery voltage detection, the charger will go into the formal charging process.

Figure 18:
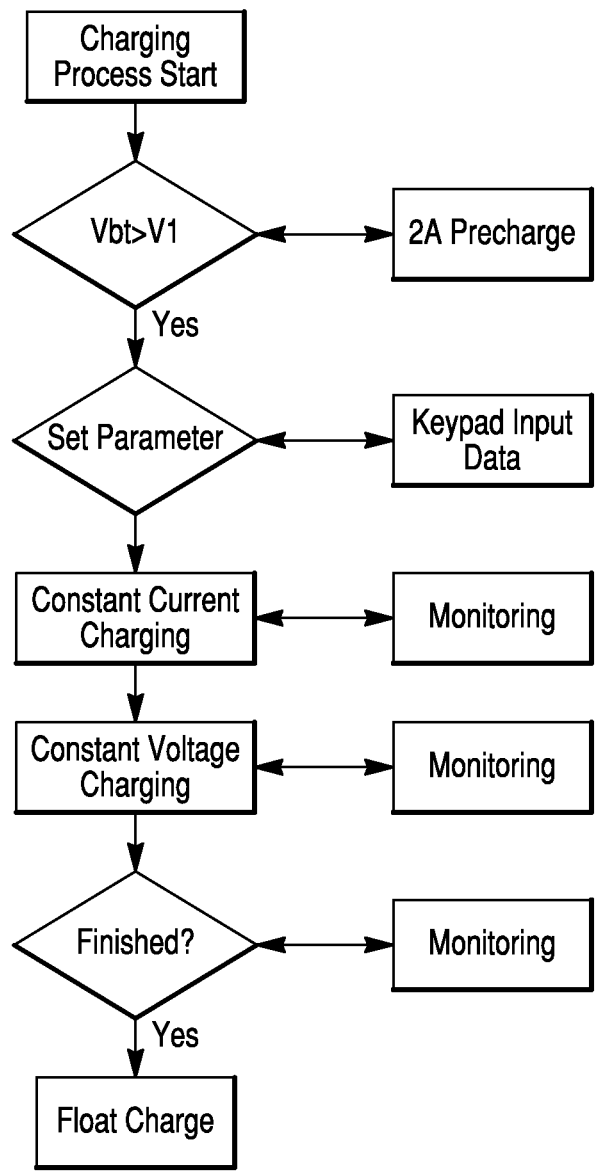
FIG. 18 is a software design flowchart for the charging process according to the preferred embodiment of the present invention.
Figure 19:
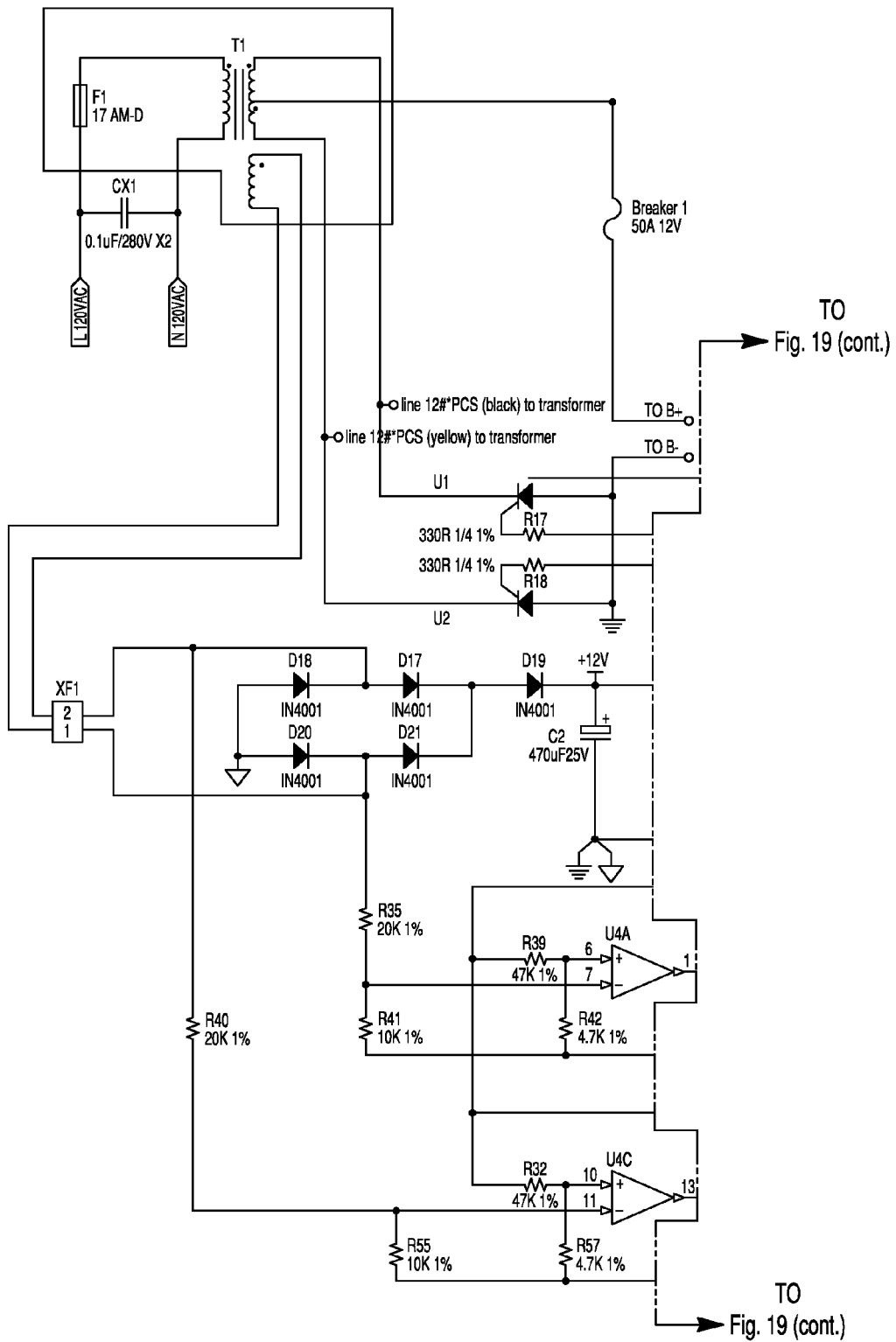
FIG. 19 is an illustration of the circuit design and diagram according to the preferred embodiment of the present invention.
Figure 19:
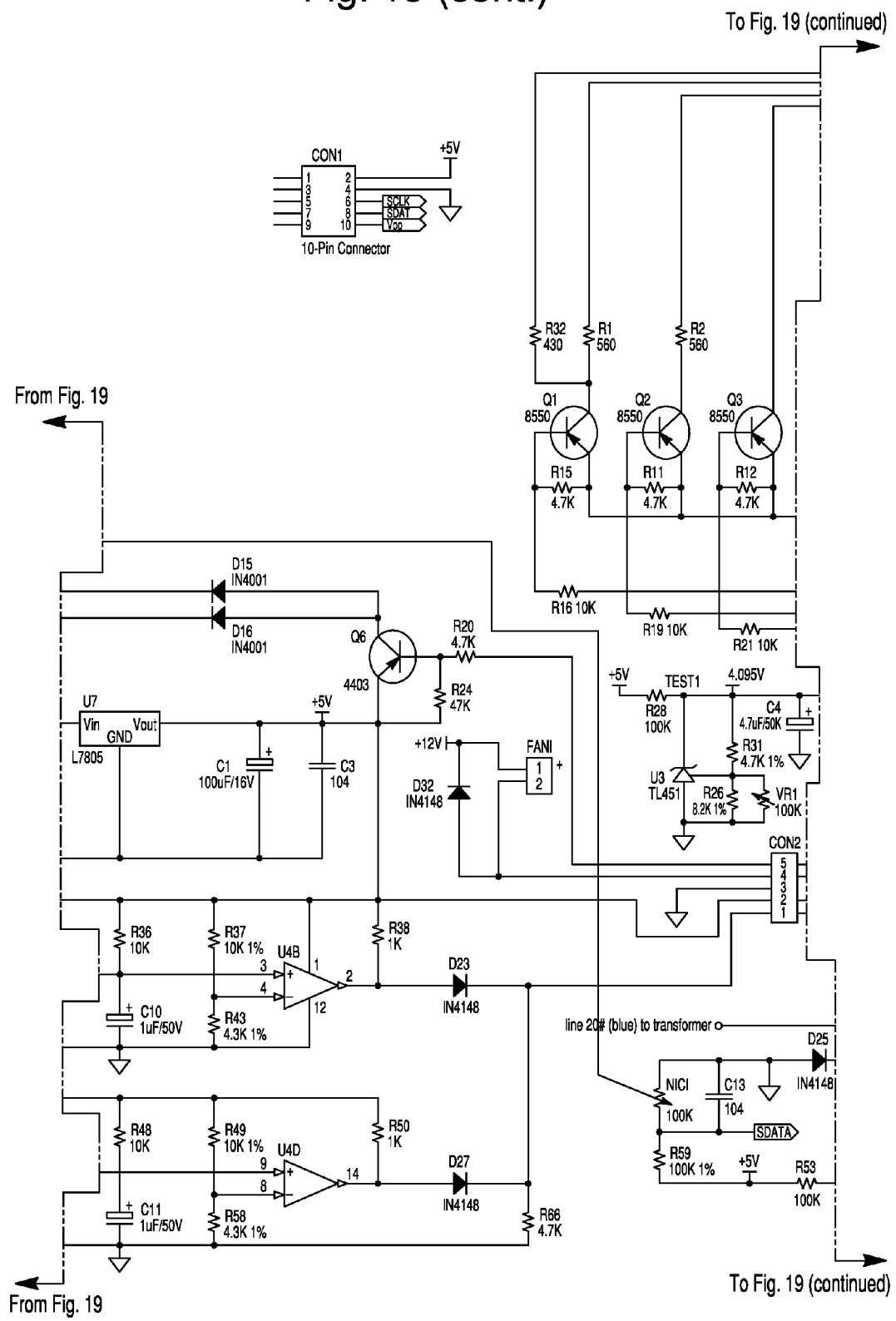
Figure 19:
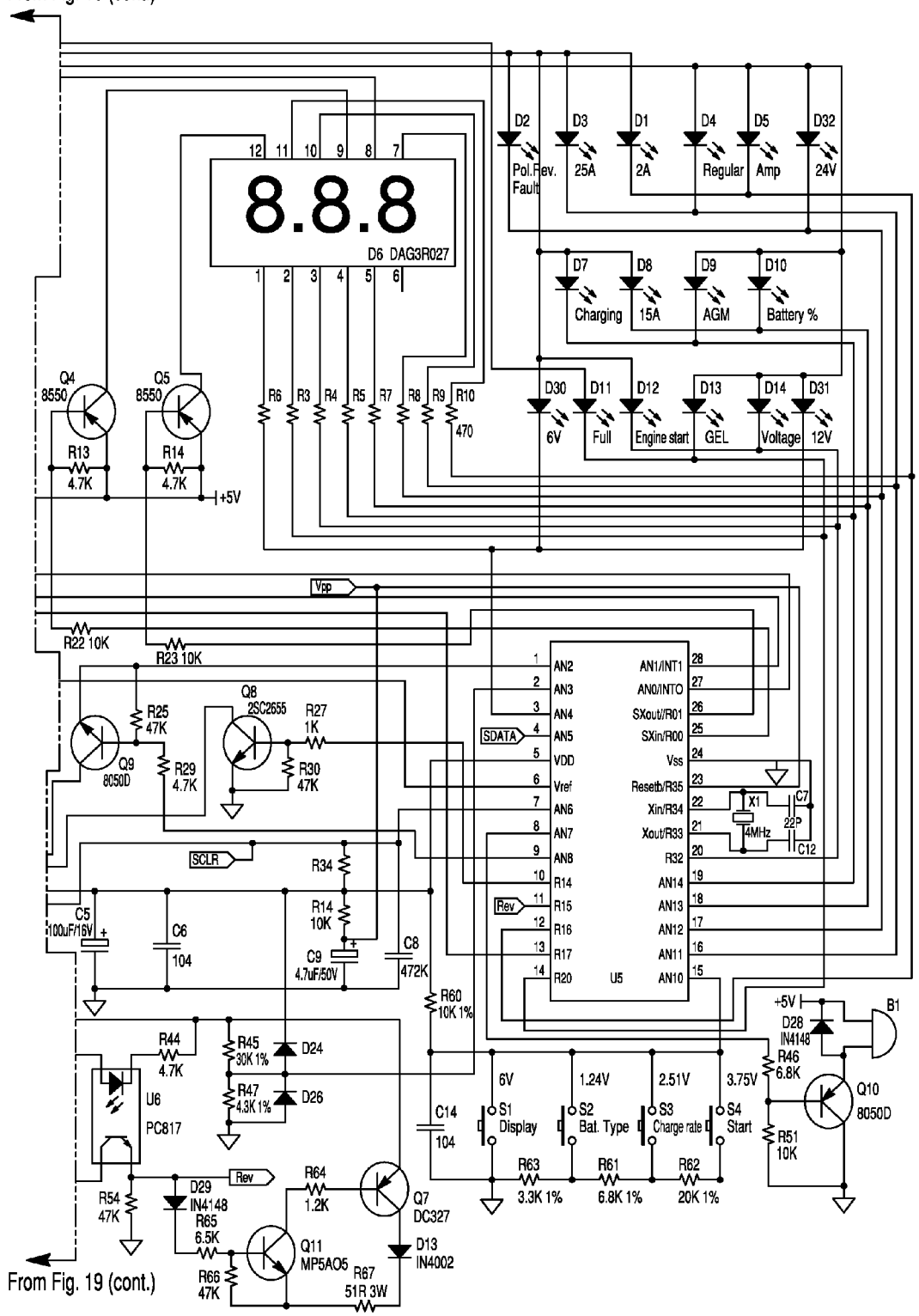

After the finish of voltage detection stage, the charger will setup the parameter for a proper charging process and start the charging as illustrated by the charging process flowchart of FIG. 18. V1 is the parameter to determine whether the battery needs to have a pre-charge stage, whereby:
V1 is 5V for 6V battery mode
V1 is 10V for 12V battery mode
V1 is 20V for 24V battery mode.

If Vbt<V1, a 2 A pre-charge mode is processed which can help to maintain the battery and extend the battery life.

Upon completion of the pre-charge mode, the charger will setup different parameters according to user settings for battery types and charging rates.

The charger will enter bull charge mode which is constant current charging. During the charging, temperature and status is monitor and will dynamic adjusting the charging characteristic.

With voltage arrive the pre-set level; charging will go into the tap off mode under a constant voltage condition.

The foregoing detailed description of the certain exemplary embodiments of the invention has been provided for the purpose of explaining the principles of the invention and its practical application, thereby enabling others skilled in the art to understand the invention for various embodiments and with various modifications as are suited to the particular use contemplated. This description is not intended to be exhaustive or to limit the invention to the precise embodiments disclosed. Although only a few embodiments have been disclosed in detail above, other embodiments are possible and the inventors intend these to be encompassed within this specification and the scope of the appended claims. The specification describes specific examples to accomplish a more general goal that may be accomplished in another way. Modifications and equivalents will be apparent to practitioners skilled in this art and are encompassed within the spirit and scope of the appended claims and their appropriate equivalents. This disclosure is intended to be exemplary, and the claims are intended to cover any modification or alternative which might be predictable to a person having ordinary skill in the art.

Only those claims which use the words "means for" are to be interpreted under 35 USC 112, sixth paragraph. Moreover, no limitations from the specification are to be read into any claims, unless those limitations are expressly included in the claims.

What is claimed is:

1. A method of auto-voltage detection, comprising:
determining a condition of a battery based at least in part on a response to a predetermined test charge; and
determining a voltage rating of the battery based at least in part on the condition of the battery and a response to a precharge process.

2. The method of claim 1, further comprising measuring at least one characteristic of the battery.

3. The method of claim 2, wherein the at least one characteristic of the battery comprises a terminal voltage of the battery, a current across a battery, or a temperature of the battery.

4. The method of claim 1, wherein the condition of the battery is one of ready to be charged, charged, or faulty.

5. The method of claim 1, wherein the response to the predetermined test charge comprises an initial terminal voltage.

6. The method of claim 1, wherein the magnitude of the predetermined test charge is between 1 amp and 10 amps.

7. The method of claim 6, wherein the magnitude of the predetermined test charge is 2 amps.

8. The method of claim 1, wherein the duration of the predetermined test charge is between 0.5 seconds and 10 seconds.

9. The method of claim 8, wherein the duration of the predetermined test charge is 1 second.

10. The method of claim 1, wherein the precharge process comprises the steps of
applying a first predetermined precharge current to the battery for a first predetermined period of time;
waiting a second predetermined period of time;
applying a second predetermined precharge current to the battery for a third predetermined period of time; and
waiting a fourth predetermined period of time.

11. The method of claim 10, wherein the first predetermined period of time, the second predetermined period of time, the third predetermined period of time, and the fourth predetermined period of time are each between 15 seconds and 120 seconds.

12. The method of claim 11, wherein the first predetermined period of time, the second predetermined period of time, the third predetermined period of time, and the fourth predetermined period of time are each 120 seconds.

13. The method of claim 1, wherein the battery comprises a car battery.

14. The method of claim 1, wherein the voltage rating of the battery is 6V, 12V, or 24V.

15. The method of claim 1, further comprising charging the battery based at least in part on the voltage rating of the battery.

16. The method of claim 15, further comprising charging the battery based at least in part on at least one charging setting.

17. A method for auto-voltage detection comprising:
applying a predetermined test charge to a battery;
measuring the initial terminal voltage of the battery in response to the predetermined test charge;
determining a condition of a battery based at least in part on the voltage response;
applying a first predetermined precharge current to the battery for a first predetermined period of time;
waiting a second predetermined period of time;
applying a second predetermined precharge current to the battery for a third predetermined period of time;
waiting a fourth predetermined period of time;
determining a voltage rating of the battery based at least in part on the condition of the battery and a measured response to a precharge process; and
charging the battery based at least in part on the voltage rating of the battery.

18. The method of claim 17, wherein
the predetermined test charge has a magnitude of 2 amps and a duration of 1 second,
the first predetermined precharge current has a magnitude of 2 amps,
the first predetermined period of time is 120 seconds,
the second predetermined period of time is 30 seconds,
the second predetermined precharge current has a magnitude of 2 amps,
the third predetermined period of time is 120 seconds, and
the fourth predetermined period of time is 30 seconds.

19. A system for auto-voltage detection comprising:
a battery charger, and
a microprocessor in communication with the battery charger and configured to determine a condition of a battery based at least in part on a measured response to a predetermined test charge, and further configured to determine a voltage rating of a battery based at least in part on the condition of the battery and a response to a precharge process.

20. The system of claim 19, wherein the charging unit is configured to measure a current produced by a battery, a voltage of the battery, and a temperature of the battery.

21. The system of claim 19, wherein the precharge process comprises
applying a first predetermined precharge current to the battery for a first predetermined period of time;
waiting a second predetermined period of time;
applying a second predetermined precharge current to the battery for a third predetermined period of time; and
waiting a fourth predetermined period of time.

22. The system of claim 19, wherein the battery charger can charge at least one of a 6V battery, 12V battery, 24V battery, 48V battery, and 72V battery.

23. The system of claim 19, further comprising an input device comprising a keypad for entering a charging setting.

* * * * *